US012800676B2

(12) United States Patent
Tada et al.

(10) Patent No.: US 12,800,676 B2
(45) Date of Patent: Nov. 17, 2026

(54) COMMUNICATION SYSTEM

(71) Applicant: DENSO CORPORATION, Kariya-city (JP)

(72) Inventors: Akira Tada, Kariya-city (JP); Tomohisa Kishigami, Kariya-city (JP); Tomoya Tokunaga, Kariya-city (JP); Ryota Kameoka, Kariya-city (JP); Yoji Homma, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 161 days.

(21) Appl. No.: 18/829,367

(22) Filed: Sep. 10, 2024

(65) Prior Publication Data

US 2025/0085360 A1 Mar. 13, 2025

(30) Foreign Application Priority Data

Sep. 13, 2023 (JP) ................................ 2023-148516
Aug. 13, 2024 (JP) ................................ 2024-134985

(51) Int. Cl.
*G01R 31/74* (2020.01)
*G01R 31/52* (2020.01)

(52) U.S. Cl.
CPC ............. *G01R 31/74* (2020.01); *G01R 31/52* (2020.01)

(58) Field of Classification Search
None
See application file for complete search history.

(56) References Cited

U.S. PATENT DOCUMENTS

2004/0029556 A1 2/2004 Goto et al.
2015/0112510 A1 4/2015 Tokunaga et al.
2023/0296692 A1* 9/2023 Hanawa ................ G01R 31/52 307/9.1

FOREIGN PATENT DOCUMENTS

JP 2004-017676 A 1/2004
JP 2015-081021 A 4/2015

* cited by examiner

*Primary Examiner* — Jas A Sanghera
(74) *Attorney, Agent, or Firm* — Harness, Dickey & Pierce, P.L.C.

(57) ABSTRACT

A communication system includes a first control device that receives a power supply from a power source via a first electronic fuse, a second control device that is data-communicably connected to the first control device and receives a power supply from the power source via a second electronic fuse, a management device that is data-communicably connected between the first control device and the second control device; a switching control section configured to execute switching control to switch the first electronic fuse and the second electronic fuse between an on state and an off state, a diagnostic information storage section configured to store diagnostic information related to communication with the first control device, and a state information storage section configured to store first fuse state information related to a state of the first electronic fuse, which is referred to for invalidating the diagnostic information.

18 Claims, 17 Drawing Sheets

FIG. 17

| CONTROL TARGET | 1ST CLUSTER | 2ND CLUSTER | 3RD CLUSTER | 4TH CLUSTER | 5TH CLUSTER | 6TH CLUSTER | 7TH CLUSTER |
|---|---|---|---|---|---|---|---|
| ELECTRONIC FUSE 15 (ECU3) | ✓ | | ✓ | | | | |
| ECU 506 | | ✓ | | ✓ | | | |
| ELECTRONIC FUSE 16 (ECU4) | ✓ | | | | ✓ | | |
| ELECTRONIC FUSE 504 (SENSOR 501) | | ✓ | | | | ✓ | |
| ELECTRONIC FUSE 505 (ACTUATOR 502) | | ✓ | | | | | ✓ |

COMMUNICATION SYSTEM

CROSS REFERENCE TO RELATED APPLICATION

This application is based on Japanese Patent Application No. 2023-148516 filed on Sep. 13, 2023, and Japanese Patent Application No. 2024-134985 filed on Aug. 13, 2024, the disclosures of which are incorporated herein by reference.

TECHNICAL FIELD

The present disclosure relates to a communication system including an electronic fuse.

BACKGROUND

A related art describes an in-vehicle network system that includes a power supply relay that individually switches on/off of a power source of an electronic control device for each of a plurality of electronic control devices, determines a control content for switching on/off of the power source of a specific electronic control device for the specific electronic control device corresponding to a scene identified based on a situation of a vehicle, and switches on/off of the power source supplied to the specific electronic control device using the power supply relay based on the determined control content.

SUMMARY

A communication system includes a first control device that receives a power supply from a power source via a first electronic fuse, a second control device that is data-communicably connected to the first control device and receives a power supply from the power source via a second electronic fuse, a management device that is data-communicably connected between the first control device and the second control device; a switching control section configured to execute switching control to switch the first electronic fuse and the second electronic fuse between an on state and an off state, a diagnostic information storage section configured to store diagnostic information related to communication with the first control device, and a state information storage section configured to store first fuse state information related to a state of the first electronic fuse, which is referred to for invalidating the diagnostic information.

BRIEF DESCRIPTION OF DRAWINGS

FIG. 17 is a diagram illustrating a correspondence relationship between control targets and clusters.

DETAILED DESCRIPTION

As a result of detailed studies by the inventors, a difficulty that, in a communication system including a plurality of electronic control devices and configured to switch on/off of a power source of the electronic control device using an electronic fuse, an abnormality of communication interruption is erroneously detected and abnormality detection accuracy is deteriorated has been found.

The present disclosure provides a technique to improve abnormality detection accuracy in a communication system.

According to one aspect of the present disclosure, a communication system includes a first control device that receives a power supply from a power source via a first electronic fuse, a second control device that is data-communicably connected to the first control device and receives a power supply from the power source via a second electronic fuse, a management device that is data-communicably connected between the first control device and the second control device; a switching control section configured to execute switching control to switch the first electronic fuse and the second electronic fuse between an on state and an off state, a diagnostic information storage section configured to store diagnostic information related to communication with the first control device, and a state information storage section configured to store first fuse state information related to a state of the first electronic fuse, which is referred to for invalidating the diagnostic information.

In the communication system of the present disclosure configured as described above, it is possible to determine whether to invalidate the diagnostic information related to communication with the first control device by referencing the first fuse state information stored in the state information storage section. Therefore, in the communication system of the present disclosure, it is possible to suppress occurrence of an event in which it is determined that an abnormality related to communication has occurred in the first control device although no abnormality related to communication has occurred in the first control device due to the first electronic fuse being switched to the off state. Accordingly, the communication system of the present disclosure can improve the abnormality detection accuracy.

First Embodiment

Figure 1:
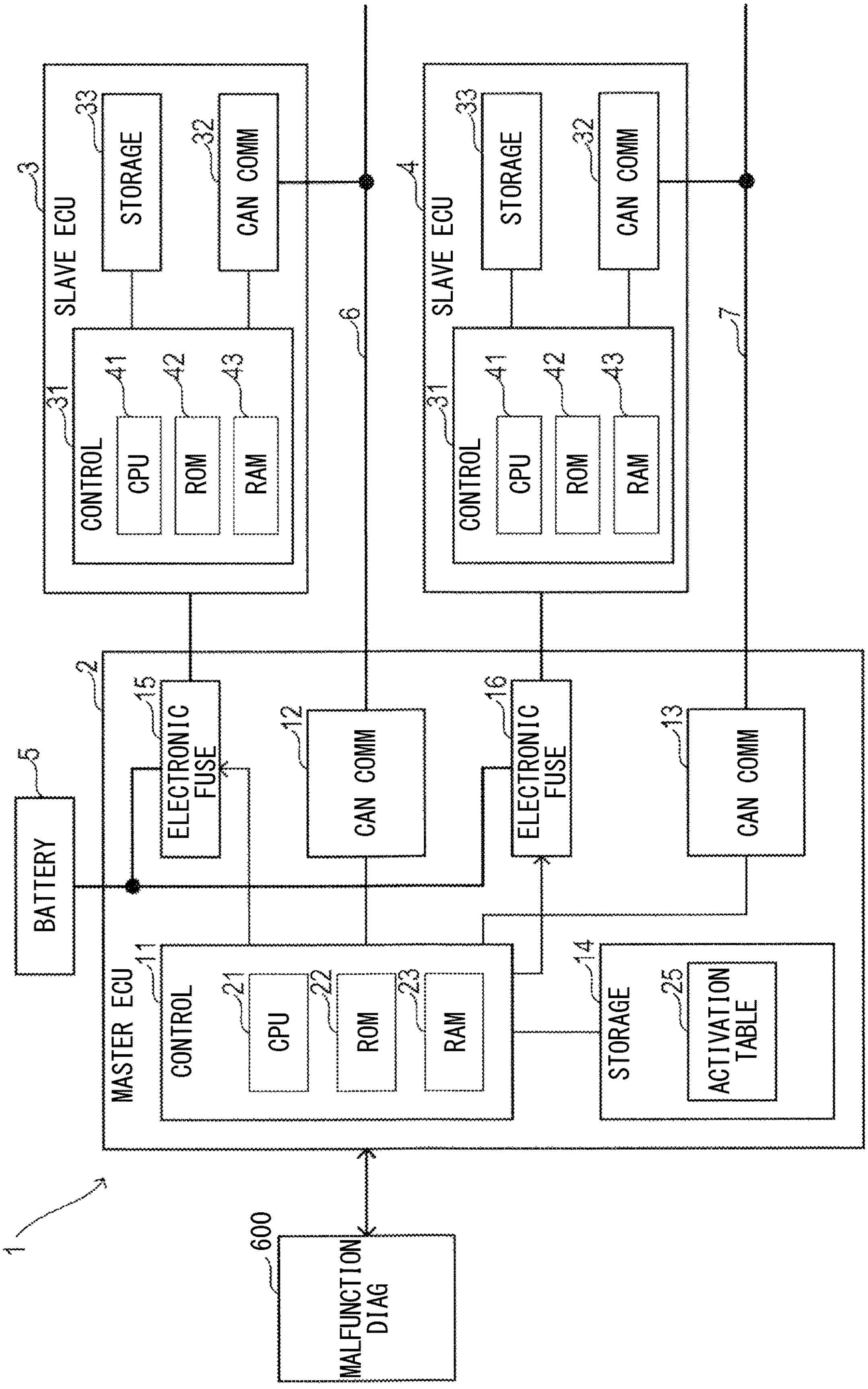
FIG. 1 is a block diagram illustrating a configuration of a communication system according to the first embodiment.

Hereinafter, the first embodiment of the present disclosure will be described with reference to the drawings. A communication system 1 of the present embodiment is mounted on a vehicle and includes a master ECU 2, slave ECUs 3 and 4, and a battery 5 as illustrated in FIG. 1. ECU stands for Electronic Control Unit. Hereinafter, the master ECU 2 and the slave ECUs 3 and 4 are also collectively referred to as nodes.

The master ECU 2 and the slave ECU 3 are data-communicably connected to each other via a communication bus 6. The master ECU 2 and the slave ECU 4 are data-communicably connected to each other via a communication bus 7.

The battery 5 supplies power to each section of the vehicle with a direct-current battery voltage (for example, 12 V). The master ECU 2 and the slave ECUs 3 and 4 operate by receiving a power supply from the battery 5.

The master ECU 2 includes a control section 11, CAN communication sections 12 and 13, a storage section 14, and electronic fuses 15 and 16. CAN stands for Controller Area Network. The communication protocol of the communication system 1 is not limited to CAN.

The control section 11 is an electronic control device mainly including a microcomputer including a CPU 21, a ROM 22, a RAM 23, and the like. Various functions of the microcomputer are implemented by the CPU 21 executing a program stored in a non-transitory tangible recording medium. In this example, the ROM 22 corresponds to a non-transitory tangible recording medium storing a program. Further, by executing the program, a method corresponding to the program is executed. Some or all of the functions executed by the CPU 21 may be configured as hardware by one or a plurality of ICs or the like. Furthermore, the number of microcomputers constituting the control section 11 may be one or more.

The CAN communication section 12 performs communication with the slave ECU 3 connected to the communication bus 6 by transmitting and receiving a communication frame based on the CAN communication protocol. The CAN communication section 13 performs communication with the slave ECU 4 connected to the communication bus 7 by transmitting and receiving a communication frame based on the CAN communication protocol. Hereinafter, the communication frame of the CAN is referred to as a CAN frame.

The storage section 14 is a storage device for storing various pieces of data. The storage section 14 stores an activation table 25 to be described later. The electronic fuse 15 is disposed on a power supply path between the battery 5 and the slave ECU 3. The electronic fuse 16 is disposed on a power supply path between the battery 5 and the slave ECU 4.

The electronic fuses 15 and 16 each include a switching element (for example, MOSFET) and a control circuit. The control circuit of each of the electronic fuses 15 and 16 is configured to cut off a power supply path by switching the switching element from the on state to the off state in a case where the value of the current flowing through the power supply path exceeds a preset overcurrent determination value.

The control circuit of each of the electronic fuses 15 and 16 is configured to conduct or cut off a power supply path by turning on or off the switching element in accordance with a command from the control section 11.

Each of the slave ECUs 3 and 4 includes a control section 31, a CAN communication section 32, and a storage section 33. The control section 31 is an electronic control device mainly including a microcomputer including a CPU 41, a ROM 42, a RAM 43, and the like. Various functions of the microcomputer are implemented by the CPU 41 executing a program stored in a non-transitory tangible recording medium. In this example, the ROM 42 corresponds to a non-transitory tangible recording medium storing a program. Further, by executing this program, a method corresponding to the program is executed. Some or all of the functions executed by the CPU 41 may be configured as hardware by one or a plurality of ICs or the like. Furthermore, the number of microcomputers constituting the control section 31 may be one or more.

The CAN communication section 32 of the slave ECU 3 performs communication with a communication device (that is, the master ECU 2) connected to the communication bus 6 based on the CAN communication protocol. The CAN communication section 32 of the slave ECU 4 performs communication with a communication device (that is, the master ECU 2) connected to the communication bus 7 based on the CAN communication protocol.

The storage section 33 is a storage device for storing various pieces of data. The master ECU 2 is connected to a vehicle malfunction diagnosis device 600 (so-called a diagnostic tester). The malfunction diagnosis device 600 is installed in a vehicle dealer, a maintenance factory, or the like.

The malfunction diagnosis device 600 is configured to be detachable via a connector (not illustrated), and is connected to the master ECU 2 at the time of malfunction diagnosis or the like. The malfunction diagnosis device 600 can acquire various types of information from the master ECU 2 and the slave ECUs 3 and 4 via the master ECU 2 and update data stored in the master ECU 2 and the slave ECUs 3 and 4.

The CAN frame includes a start of frame, an arbitration field, a control field, a data field, a CRC field, an ACK field, and an end of frame. The arbitration field includes an 11-bit or 29-bit identifier (that is, ID) and 1-bit RTR bit.

An 11-bit identifier used in CAN communication is referred to as a CAN ID. The CAN ID is preset based on content of data included in the CAN frame, a transmission source of the CAN frame, a transmission destination of the CAN frame, and the like.

The data field is a payload including first data, second data, third data, fourth data, fifth data, sixth data, seventh data, and eighth data each of which has 8 bits (that is, one byte).

The communication system 1 forms a partial network which is a power supply control method based on communication control of the CAN protocol standard defined in ISO11898-6. Therefore, the communication system 1 realizes low power consumption by collectively transitioning one or a plurality of nodes belonging to a communication group to a wake-up state (that is, the activation state) or a sleep state (that is, the dormancy state) for each communication group to be described later. The node is in a normal operation state with the function allocated to the node available without restriction by waking up, and is in a low power consumption operation state with the available function restricted by sleeping.

In the communication system 1, when waking up a node in a sleep state, an NM frame that is a CAN frame including activation information designating an activation group is used. NM stands for Network Management.

Figure 2:
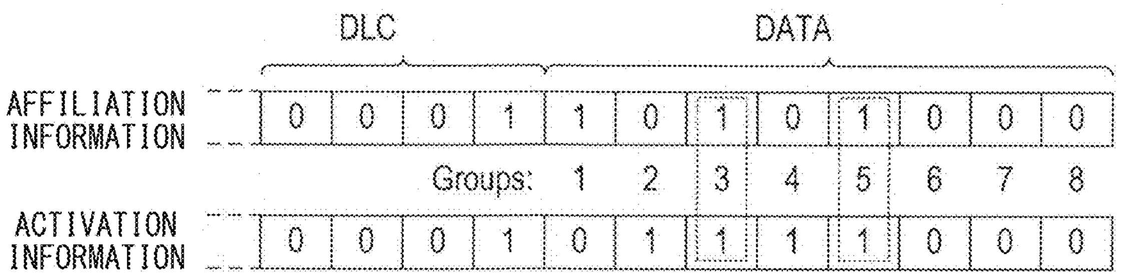
FIG. 2 is an explanatory diagram illustrating affiliation information and activation information.

The activation information is set as illustrated in FIG. 2, for example. DLC stands for Data Length Code, and is a region representing a size of a data field in a CAN frame in byte units. That is, the activation information is stored in the data field of the CAN frame. Here, in order to simplify the description, a case where DLC is 1 byte (that is, 8 bits) will be described. An activation group is associated with each bit of 8-bit data representing activation information.

In the activation information set in the NM frame, a bit corresponding to the activation group to be activated is set to 1. Each node stores affiliation information indicating an activation group to which the subject node belongs. The affiliation information has the same data length as the activation information, and allocation of each bit is similar to the activation information. Then, in the affiliation information, a bit corresponding to the activation group to which the subject node belongs is set to 1.

Each node compares the activation information extracted from the NM frame with the affiliation information stored in the subject node to determine whether the communication group to which the subject node belongs is an activation target.

For example, the affiliation information illustrated in FIG. 2 indicates that the information belongs to the first communication group, the third communication group, and the fifth communication group. The activation information illustrated in FIG. 2 indicates activation of the second communication group, the third communication group, the fourth communication group, and the fifth communication group. Since the third communication group and the fifth communication group are included in both the affiliation information and the activation information illustrated in FIG. 2, the subject node determines that the subject node is an activation target as the third communication group and the fifth communication group.

The activation table 25 specifies a correspondence relationship between an activation group and an electronic fuse (hereinafter referred to as a conduction fuse) to be turned on. For example, in a case where the activation group is the first communication group, the activation table 25 specifies that the conduction fuse is the electronic fuse 15. For example, in a case where the activation group is the second communication group, the activation table 25 specifies that the conduction fuse is the electronic fuse 16. For example, in a case where the activation group is the third communication group, the activation table 25 specifies that the conduction fuses are the electronic fuses 15 and 16. For example, in a case where the activation group is the fourth communication group, the activation table 25 specifies that there is no conduction fuse.

Therefore, for example, when acquiring an NM frame designating the first communication group as the activation group, the master ECU 2 turns on the electronic fuse 15 and turns off the electronic fuse 16. In this way, turning off the electronic fuses 15 and 16 with the activation group designated is referred to as "intentionally cutting off the electronic fuses 15 and 16". Therefore, turning off the electronic fuses 15 and 16 in a case where an excessive current flows through the power supply path corresponds to "unintentionally cutting off the electronic fuses 15 and 16".

In a case where there are a plurality of activation groups, the master ECU 2 turns on the electronic fuses corresponding to the plurality of activation groups by OR (logical sum), and turns off the electronic fuses other than the electronic fuses corresponding to the plurality of activation groups by AND (logical product). For example, even in a case where a plurality of events occur and an NM frame designating the first, third, and fifth communication groups as activation groups and an NM frame designating the first, fourth, and sixth communication groups as activation groups occur, the master ECU 2 refers to both NM frames and turns off the electronic fuses other than the electronic fuses corresponding to the plurality of activation groups by AND (logical product).

Figure 3:
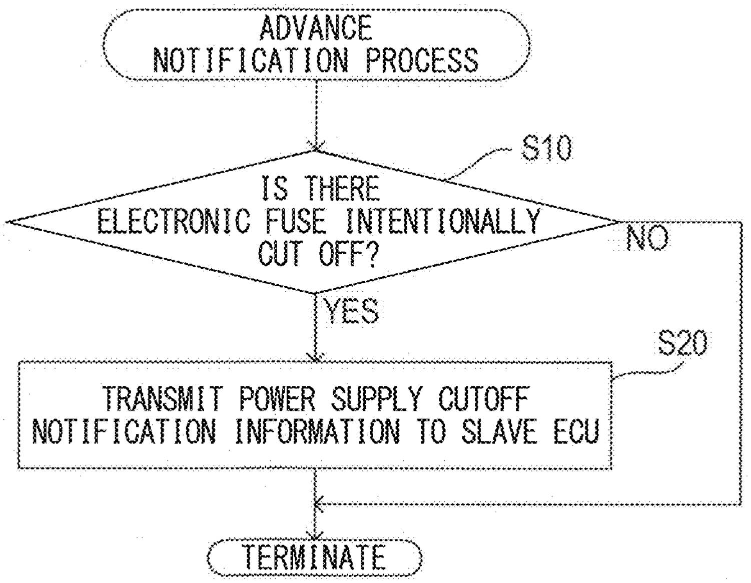
FIG. 3 is a flowchart illustrating an advance notification process according to the first embodiment.

Next, a procedure of the advance notification process executed by the control section 11 of the master ECU 2 will be described. The advance notification process is a process repeatedly executed during activation of the master ECU 2. When the advance notification process is executed, the CPU 21 of the control section 11 determines in S10 whether there is an electronic fuse to be intentionally cut off as illustrated in FIG. 3. Here, in a case where there is no electronic fuse to be intentionally cut off, the CPU 21 terminates the advance notification process. On the other hand, in a case where there is an electronic fuse to be intentionally cut off, in S20, the CPU 21 transmits to the slave ECU connected to the electronic fuse to be intentionally cut off, power supply cutoff notification information for making a notification that the power supply from the battery 5 is cut off, and terminates the advance notification process. The process of S20 is performed before the electronic fuse is intentionally cut off.

In a case where the electronic fuse 15 is intentionally cut off, power supply cutoff notification information is transmitted to the slave ECU 3. In a case where the electronic fuse 16 is intentionally cut off, power supply cutoff notification information is transmitted to the slave ECU 4. Upon receiving the power supply cutoff notification information, the slave ECUs 3 and 4 store the received power supply cutoff notification information in the storage section 33 together with reception date and time information indicating the date and time when the power supply cutoff notification information is received.

Next, a procedure of the notification checking process executed by the control section 31 of the slave ECUs 3 and 4 will be described. The notification checking process is executed immediately after the slave ECUs 3 and 4 are activated by the start of the power source from the battery 5.

Figure 4:
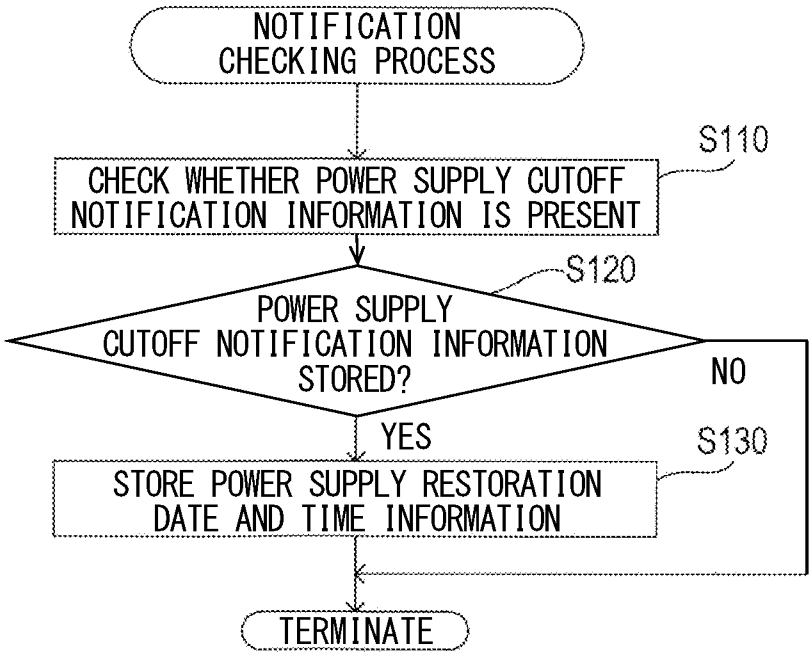
FIG. 4 is a flowchart illustrating a notification checking process according to the first embodiment.

When the notification checking process is executed, in S110, the CPU 41 of the control section 31 checks whether the power supply cutoff notification information is stored in the storage section 33 as illustrated in FIG. 4. In S120, the CPU 41 determines whether the power supply cutoff notification information is stored in the storage section 33 based on the checking result in S110. Here, in a case where the power supply cutoff notification information is not stored in the storage section 33, the CPU 41 terminates the notification checking process.

On the other hand, in a case where the power supply cutoff notification information is stored in the storage section 33, in S130, the CPU 41 stores, in the storage section 33, information indicating the date and time when the slave ECUs 3 and 4 were most recently activated by the start of power supply from the battery 5 as power supply restoration date and time information, and terminates the notification checking process.

An operator who performs vehicle inspection connects the malfunction diagnosis device 600 to the master ECU 2 to acquire diagnostic information and power supply restoration date and time information stored in the master ECU 2 and the slave ECUs 3 and 4.

The operator checks the acquired diagnostic information and power supply restoration date and time information. Then, the operator invalidates the diagnostic information related to the corresponding slave ECU from the cutoff notification reception date and time indicated by the reception date and time information of the power supply cutoff notification information to the power supply restoration date and time indicated by the power supply restoration date and time information. For example, in a case where the power supply restoration date and time information is stored in the slave ECU 3, the operator invalidates the diagnostic information that occurred from the reception date and time of the power supply cutoff notification information to the power supply restoration date and time and relates to the slave ECU 3 in the master ECU 2 and the slave ECU 4. The diagnostic information related to the slave ECU 3 includes, for example, an abnormality in which communication from the slave ECU 3 is interrupted.

Specifically, invalidation of the diagnostic information includes, for example, adding invalidation information indicating that the diagnostic information is invalid to the diagnostic information. Further, the master ECU 2 and the slave ECUs 3 and 4 may invalidate the diagnostic information related to other nodes from the cutoff notification reception date and time to the power supply restoration date and time by acquiring the reception date and time information and the power supply restoration date and time information from other nodes.

Further, the malfunction diagnosis device 600 may invalidate the diagnostic information related to the slave ECUs 3 and 4 from the cutoff notification reception date and time to the power supply restoration date and time by acquiring the reception date and time information and the power supply restoration date and time information from the slave ECUs 3 and 4.

Further, a center installed outside the vehicle may invalidate the diagnostic information related to the slave ECUs 3 and 4 from the cutoff notification reception date and time to the power supply restoration date and time by acquiring the reception date and time information and the power supply restoration date and time information from the slave ECUs 3 and 4 via remote diagnostics.

The communication system 1 configured as described above includes the slave ECU 3, the slave ECU 4, the master ECU 2, the control section 11, the storage section 33 of the slave ECU 4, and the storage section 33 of the slave ECU 3.

The slave ECU 3 receives a power supply from the battery 5 via the electronic fuse 15. The slave ECU 4 is data-communicably connected to the slave ECU 3 and receives a power supply from the battery 5 via the electronic fuse 16.

The master ECU 2 is data-communicably connected to the slave ECUs 3 and 4. The control section 11 is configured to perform switching control to switch the electronic fuses 15 and 16 to an on state or an off state.

The storage section 33 of the slave ECU 4 is configured to store diagnostic information related to communication with the slave ECU 3. The storage section 33 of the slave ECU 3 is configured to store power supply restoration date and time information, which is referenced for invalidating the diagnostic information.

In such a communication system 1, it is possible to determine whether to invalidate the diagnostic information related to communication with the slave ECU 3 by referencing the power supply restoration date and time information stored in the storage section 33 of the slave ECU 3. Therefore, in the communication system 1, it is possible to suppress occurrence of an event in which it is determined that an abnormality related to communication has occurred in the slave ECU 3 although no abnormality related to communication has occurred in the slave ECU 3 due to the electronic fuse 15 being switched to the off state. Accordingly, the communication system 1 can improve the abnormality detection accuracy.

Further, the master ECU 2 is configured to transmit, to the slave ECU 3, power supply cutoff notification information for making a notification that the power supply from the battery 5 via the electronic fuse 15 is cut off before turning off the electronic fuse 15 in order to cut off a power supply from the battery 5 to the slave ECU 3.

The slave ECU 3 is configured to determine whether the power supply cutoff notification information is stored when the slave ECU 3 is activated by the power supply from the battery 5, and store the power supply restoration date and time information indicating the date and time when the slave ECU 3 was most recently activated in a case where the power supply cutoff notification information is stored.

In such a communication system 1, in a case where the slave ECU 3 is activated by the power supply from the battery 5 after the power supply from the battery 5 is cut off due to the master ECU 2 turning off the electronic fuse 15, the slave ECU 3 stores the power supply restoration date and time information. That is, the communication system 1 can determine whether the master ECU 2 intentionally turns off the electronic fuse 15 based on whether the slave ECU 3 stores the power supply restoration date and time information. Therefore, in the communication system 1, even in a case where communication from the slave ECU 3 is interrupted due to the master ECU 2 intentionally turning off the electronic fuse 15, in a case where the power supply restoration date and time information is stored in the slave ECU 3, it can be considered that no communication interruption abnormality has occurred in the slave ECU 3. That is, the communication system 1 can suppress occurrence of an event in which it is determined that an abnormality of communication interruption has occurred in the slave ECU 3 although no abnormality has occurred in the slave ECU 3. As a result, the communication system 1 can improve the abnormality detection accuracy.

In the embodiment described above, the slave ECU 3 corresponds to the first control device, the slave ECU 4 corresponds to the second control device, the master ECU 2 corresponds to the management device, and the battery 5 corresponds to the power source.

Further, the control section 11 corresponds to the switching control section, the storage section 33 of the slave ECU 4 corresponds to the diagnostic information storage section, the storage section 33 of the slave ECU 3 corresponds to the state information storage section, and the power supply restoration date and time information corresponds to the first fuse state information.

Further, S20 corresponds to the process as the cutoff notification transmission section, S110 to S130 correspond to the process as the state information storage section, and the power supply cutoff notification information corresponds to the first power supply cutoff related information.

Second Embodiment

Hereinafter, the second embodiment of the present disclosure will be described with reference to the drawings. In the second embodiment, components different from the first embodiment will be described. Common configurations are denoted by the same reference numerals.

Figure 5:
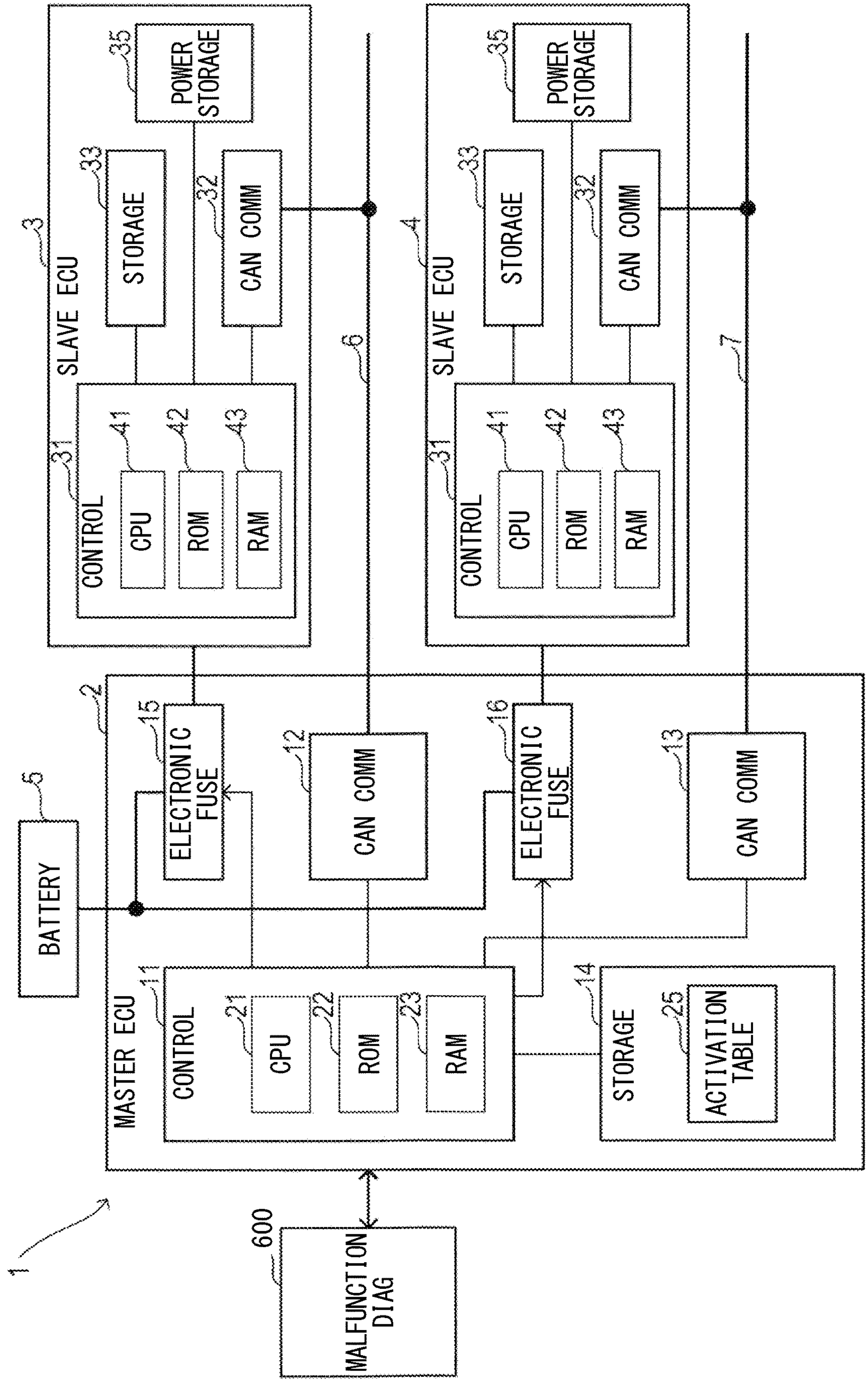
FIG. 5 is a block diagram illustrating a configuration of a communication system according to the second embodiment.

As shown in FIG. 5, a communication system 1 of the second embodiment is different from that of the first embodiment in that each of the slave ECUs 3 and 4 includes a power storage section 35. The power storage section 35 is charged by the battery voltage from the battery 5. The power storage section 35 ensures electric power that enables the slave ECUs 3 and 4 to operate for a predetermined backup time (for example, several tens of milliseconds) in a case where the supply of electric power from the battery 5 is cut off.

Next, a procedure of the notification checking process executed by the control section 31 of the slave ECUs 3 and 4 will be described. The notification checking process according to the second embodiment is a process repeatedly executed during activation of the slave ECUs 3 and 4.

Figure 6:
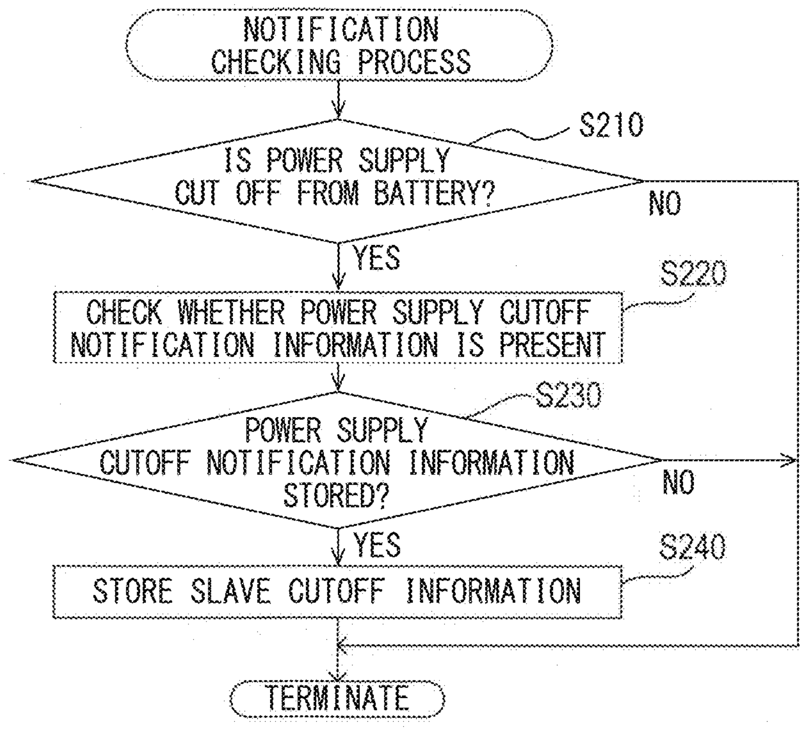
FIG. 6 is a flowchart illustrating a notification checking process according to the second embodiment.

When the notification checking process of the second embodiment is executed, in S210, the CPU 41 of the control section 31 determines whether the power supply from the battery 5 is cut off as illustrated in FIG. 6. Here, in a case where the power supply from the battery 5 is not cut off, the CPU 41 terminates the notification checking process.

On the other hand, in a case where the power supply from the battery 5 is cut off, in S220, the CPU 41 checks whether the power supply cutoff notification information is stored in the storage section 33. In S230, the CPU 41 determines whether the power supply cutoff notification information is stored in the storage section 33 based on the checking result in S220. Here, in a case where the power supply cutoff notification information is not stored in the storage section 33, the CPU 41 terminates the notification checking process.

On the other hand, in a case where the power supply cutoff notification information is stored in the storage section 33, in S240, the CPU 41 stores the slave cutoff information indicating that the power supply from the battery 5 to the slave ECUs 3 and 4 is cut off in the storage section 33 together with slave cutoff time information indicating the time when the slave cutoff information is stored, and terminates the notification checking process.

Figure 7:
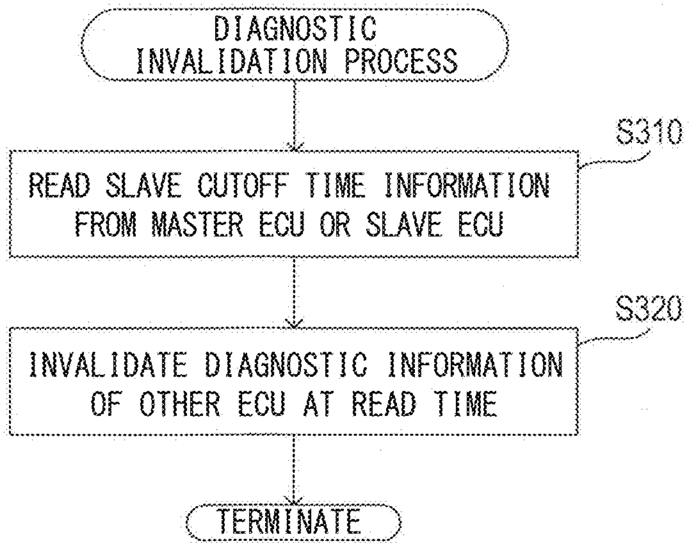
FIG. 7 is a flowchart illustrating a diagnostic invalidation process according to the second embodiment.

Next, a procedure of the diagnostic invalidation process executed by an operator who performs vehicle inspection will be described. When the diagnostic invalidation process is executed, as illustrated in FIG. 7, the operator connects the malfunction diagnosis device 600 to the master ECU 2 in S310, and reads the slave cutoff time information indicating the time when the slave cutoff information is stored from the master ECU 2 or the slave ECUs 3 and 4.

In S320, the operator invalidates the diagnostic information related to the corresponding slave ECU near the time (hereinafter, slave cutoff time) indicated by the slave cutoff time information, and terminates the diagnostic invalidation process. For example, in a case where the slave cutoff time information is read from the slave ECU 3, the operator invalidates the diagnostic information that occurs in the master ECU 2 and the slave ECU 4 at a time near the slave cutoff time and is related to the slave ECU 3.

The vicinity of the slave cutoff time may be a period from a time T1 before the slave cutoff time to a time T2 after the slave cutoff time. Further, the vicinity of the slave cutoff time may be a period from the slave cutoff time T3 to a time T4 after a preset invalidation time from the time T3.

Further, the master ECU 2 and the slave ECUs 3 and 4 may invalidate the diagnostic information related to other nodes that occurred at a time near the slave cutoff time by acquiring the slave cutoff time information from other nodes.

Further, the malfunction diagnosis device 600 may invalidate the diagnostic information related to the slave ECUs 3 and 4 that occurred at a time near the slave cutoff time by acquiring the slave cutoff time information from the slave ECUs 3 and 4.

Further, a center installed outside the vehicle may invalidate the diagnostic information related to the slave ECUs 3 and 4 that occurred at a time near the slave cutoff time by acquiring the slave cutoff time information from the slave ECUs 3 and 4 via remote diagnostics.

The communication system 1 configured as described above includes the slave ECU 3, the slave ECU 4, the master ECU 2, the control section 11, the storage section 33 of the slave ECU 4, and the storage section 33 of the slave ECU 3.

The slave ECU 3 includes the power storage section 35 and receives a power supply from the battery 5 via the electronic fuse 15. The master ECU 2 is data-communicably connected to the slave ECUs 3 and 4. The control section 11 is configured to perform switching control to switch the electronic fuses 15 and 16 to an on state or an off state.

The storage section 33 of the slave ECU 4 is configured to store diagnostic information related to communication with the slave ECU 3. The storage section 33 of the slave ECU 3 is configured to store the slave cutoff information, which is referenced for invalidating the diagnostic information.

In such a communication system 1, it is possible to determine whether to invalidate the diagnostic information related to communication with the slave ECU 3 by referencing the slave cutoff information stored in the storage section 33 of the slave ECU 3. Therefore, in the communication system 1, it is possible to suppress occurrence of an event in which it is determined that an abnormality related to communication has occurred in the slave ECU 3 although no abnormality related to communication has occurred in the slave ECU 3 due to the electronic fuse 15 being switched to the off state. Accordingly, the communication system 1 can improve the abnormality detection accuracy.

Further, the master ECU 2 is configured to transmit, to the slave ECU 3, power supply cutoff notification information for making a notification that the power supply from the battery 5 via the electronic fuse 15 is cut off before turning off the electronic fuse 15 in order to cut off a power supply from the battery 5 to the slave ECU 3.

The slave ECU 3 is configured to determine whether the power supply cutoff notification information is acquired from the master ECU 2 when the power supply from the battery 5 is cut off, and store the slave cutoff information indicating that the battery 5 is cut off in the slave ECU 3 in a case where the power supply cutoff notification information is acquired.

In such a communication system 1, in a case where the power supply from the battery 5 is cut off due to the master ECU 2 turning off the electronic fuse 15, the slave ECU 3 can receive the power supply from the power storage section 35 and store the slave cutoff information in the slave ECU 3. That is, the communication system 1 can determine whether the master ECU 2 has intentionally turned off the electronic fuse 15 based on whether the slave ECU 3 stores the slave cutoff information. Therefore, in the communication system 1, even in a case where communication from the slave ECU 3 is interrupted due to the master ECU 2 intentionally turning off the electronic fuse 15, in a case where the slave ECU 3 stores the slave cutoff information, it can be considered that no communication interruption abnormality has occurred in the slave ECU 3. That is, the communication system 1 can suppress occurrence of an event in which it is determined that an abnormality of communication interruption has occurred in the slave ECU 3 although no abnormality has occurred in the slave ECU 3. As a result, the communication system 1 can improve the abnormality detection accuracy.

In the embodiment described above, the power storage section 35 corresponds to the backup power source, S20 corresponds to the process as the cutoff notification transmission section, S240 corresponds to the process as the state information storage section, and the slave cutoff information corresponds to the power supply cutoff information.

Third Embodiment

Hereinafter, the third embodiment of the present disclosure will be described with reference to the drawings. In the third embodiment, components different from the first embodiment will be described. Common configurations are denoted by the same reference numerals.

Figure 8:
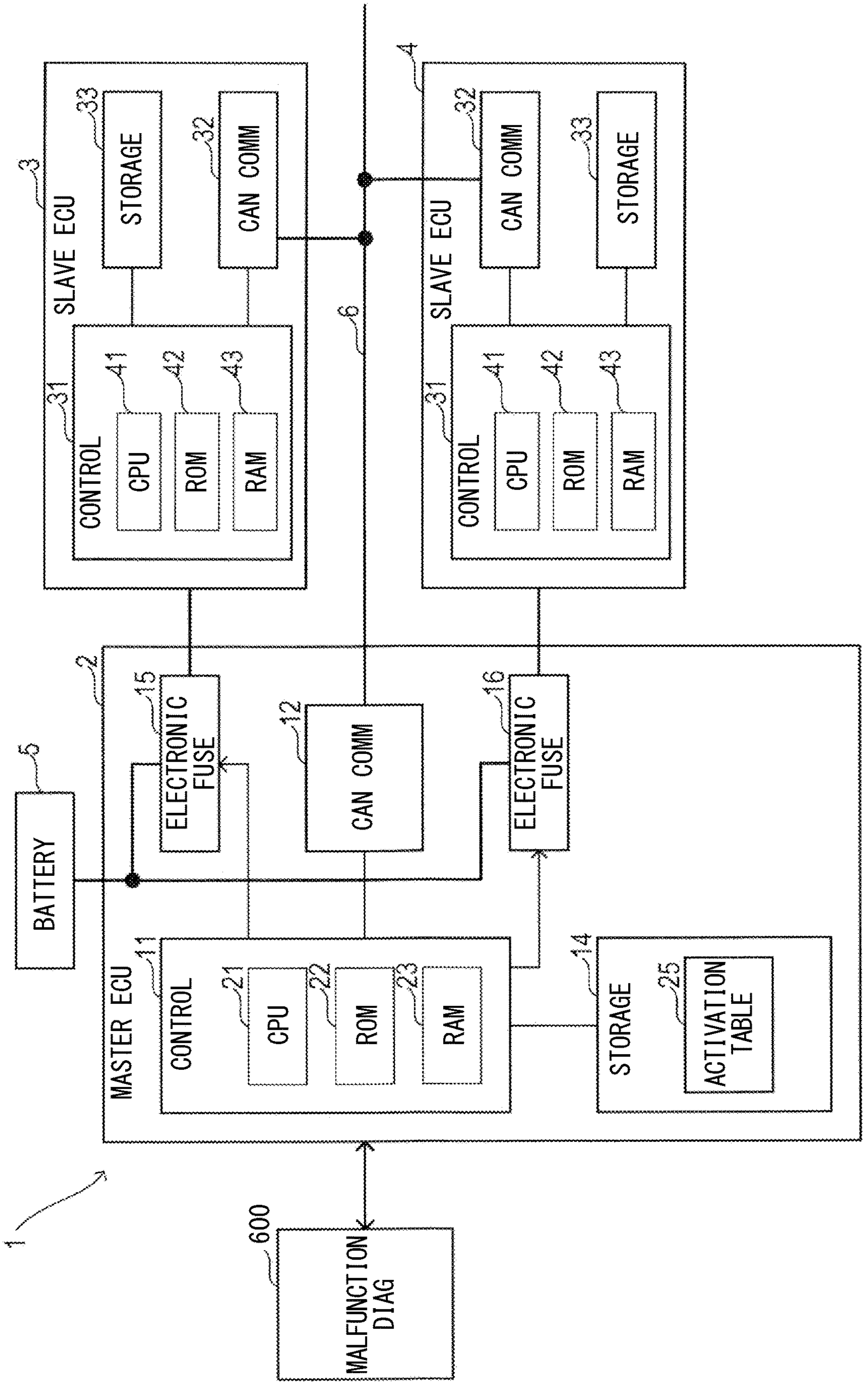
FIG. 8 is a block diagram illustrating a configuration of a communication system according to third, fourth, and fifth embodiments.

As illustrated in FIG. 8, the communication system 1 of the third embodiment is different from that of the first embodiment in that the CAN communication section 13 is omitted in the master ECU 2 and that the CAN communication section 32 of the slave ECU 4 is connected to the communication bus 6 instead of the communication bus 7.

Figure 9:
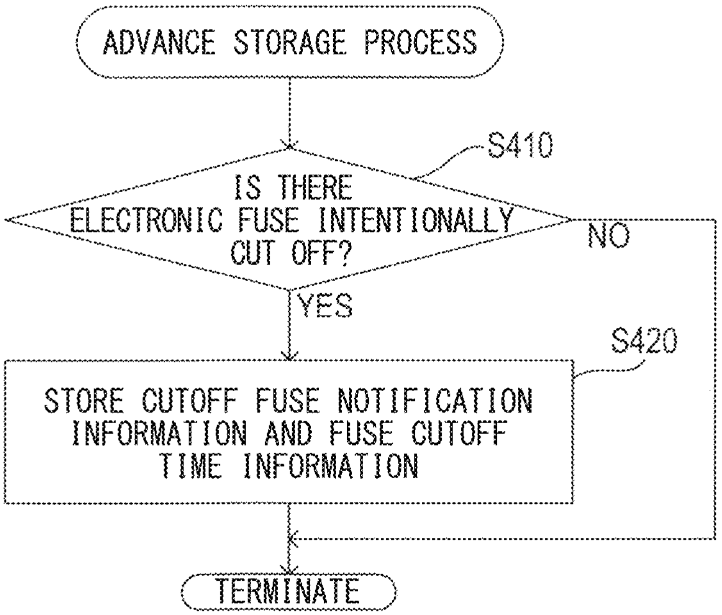
FIG. 9 is a flowchart illustrating an advance storage process according to the third embodiment.

Next, a procedure of an advance storage process executed by the control section 11 of the master ECU 2 will be described. The advance storage process is a process repeatedly executed during activation of the master ECU 2. When the advance storage process is executed, in S410, the CPU 21 of the control section 11 determines whether there is an electronic fuse to be intentionally cut off as illustrated in FIG. 9. Here, in a case where there is no electronic fuse to be intentionally cut off, the CPU 21 terminates the advance storage process. On the other hand, in a case where there is an electronic fuse to be intentionally cut off, in S420, the CPU 21 stores, in the storage section 14, the cutoff fuse notification information for making a notification of the electronic fuse to be cut off and the fuse cutoff time information indicating the time to cut off the electronic fuse, and terminates the advance storage process. The process of S420 is performed before the electronic fuse is intentionally cut off.

Figure 10:
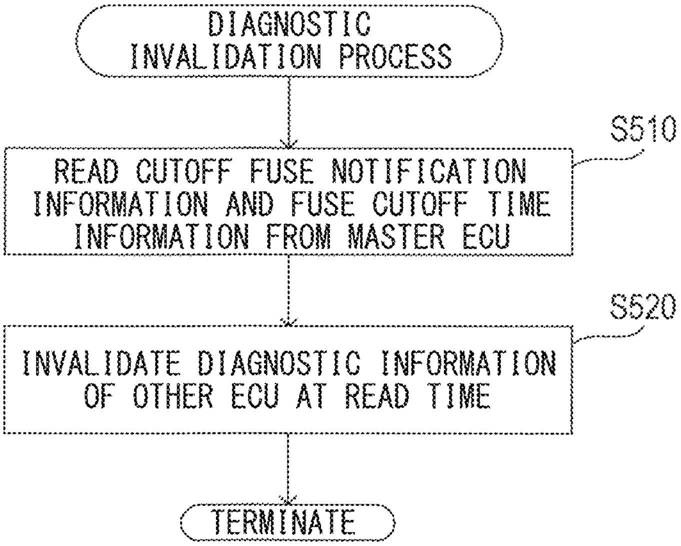
FIG. 10 is a flowchart illustrating a diagnostic invalidation process according to the third embodiment.

Next, a procedure of the diagnostic invalidation process executed by an operator who performs vehicle inspection will be described. When the diagnostic invalidation process is executed, as illustrated in FIG. 10, in S510, the operator connects the malfunction diagnosis device 600 to the master ECU 2, and reads the cutoff fuse notification information and the fuse cutoff time information from the master ECU 2.

In S520, near the time (fuse cutoff time) indicated by the fuse cutoff time information, the operator invalidates the diagnostic information related to the slave ECU connected to the electronic fuse indicated by the cutoff fuse notification information, and terminates the diagnostic invalidation process. For example, in a case where the cutoff fuse notification information indicates the electronic fuse 15, the operator invalidates the diagnostic information that occurs in the master ECU 2 and the slave ECU 4 at a time near the fuse cutoff time and is related to the slave ECU 3.

Further, the master ECU 2 may invalidate the diagnostic information related to the slave ECU near the fuse cutoff time based on the stored cutoff fuse notification information and the fuse cutoff time information.

Further, the malfunction diagnosis device 600 may invalidate the diagnostic information related to the slave ECU near the fuse cutoff time by acquiring the cutoff fuse notification information and the fuse cutoff time information from the master ECU 2.

Further, a center installed outside the vehicle may invalidate the diagnostic information related to the slave ECU near the fuse cutoff time by acquiring the cutoff fuse notification information and the fuse cutoff time information from the master ECU 2 via remote diagnostics.

The communication system 1 configured as described above includes the slave ECU 3, the slave ECU 4, the master ECU 2, the storage section 33 of the slave ECU 4, and the storage section 14 of the master ECU 2.

The slave ECU 3 receives a power supply from the battery 5 via the electronic fuse 15. The slave ECU 4 is data-communicably connected to the slave ECU 3 and receives a power supply from the battery 5 via the electronic fuse 16.

The master ECU 2 is data-communicably connected to the slave ECUs 3 and 4. The control section 11 is configured to perform switching control to switch the electronic fuses 15 and 16 to an on state or an off state.

The storage section 33 of the slave ECU 4 is configured to store diagnostic information related to communication with the slave ECU 3. The storage section 14 of the master ECU 2 is configured to store the cutoff fuse notification information and the fuse cutoff time information, which are referenced for invalidating the diagnostic information.

In such a communication system 1, it is possible to determine whether to invalidate the diagnostic information related to communication with the slave ECU 3 by referencing the cutoff fuse notification information and the fuse cutoff time information stored in the storage section 14 of the master ECU 2. Therefore, in the communication system 1, it is possible to suppress occurrence of an event in which it is determined that an abnormality related to communication has occurred in the slave ECU 3 although no abnormality related to communication has occurred in the slave ECU 3 due to the electronic fuse 15 being switched to the off state. Accordingly, the communication system 1 can improve the abnormality detection accuracy.

Further, the master ECU 2 is configured to store cutoff fuse notification information (hereinafter, first cutoff fuse notification information) for making a notification of the electronic fuse 15 to be cut off and fuse cutoff time information (hereinafter, first fuse cutoff time information) indicating a time when the electronic fuse 15 is cut off before turning off the electronic fuse 15 in order to cut off a power supply from the battery 5 to the slave ECU 3.

The master ECU 2 is configured to store cutoff fuse notification information (hereinafter, second cutoff fuse notification information) for making a notification of the electronic fuse 16 to be cut off and fuse cutoff time information (hereinafter, second fuse cutoff time information) indicating a time when the electronic fuse 16 is cut off before turning off the electronic fuse 16 in order to cut off a power supply from the battery 5 to the slave ECU 4.

In such a communication system 1, in a case where the power supply to the slave ECUs 3 and 4 is cut off due to the master ECU 2 turning off of the electronic fuses 15 and 16, the master ECU 2 stores the first and second cutoff fuse notification information and the first and second fuse cutoff time information. That is, the communication system 1 can determine whether the master ECU 2 intentionally turns off the electronic fuses 15 and 16 based on whether the master ECU 2 stores the first and second cutoff fuse notification information and the first and second fuse cutoff time information. Therefore, in the communication system 1, even in a case where communication from the slave ECUs 3 and 4 is interrupted due to the master ECU 2 intentionally turning off the electronic fuses 15 and 16, in a case where the master ECU 2 stores the first and second cutoff fuse notification information and the first and second fuse cutoff time information, it can be considered that no communication interruption abnormality has occurred near the time indicated by the first and second fuse cutoff time in the slave ECUs 3 and 4. That is, the communication system 1 can suppress occurrence of an event in which it is determined that an abnormality of communication interruption has occurred in the slave ECUs 3 and 4 although no abnormality has occurred in the slave ECUs 3 and 4. As a result, the communication system 1 can improve the abnormality detection accuracy.

In the embodiment described above, the storage section 14 of the master ECU 2 corresponds to the state information storage section, the electronic fuse 15 corresponds to the first electronic fuse, the slave ECU 3 corresponds to the first control device, the electronic fuse 16 corresponds to the second electronic fuse, the slave ECU 4 corresponds to the second control device, the storage section 14 of the master ECU 2 corresponds to the state information storage section, and S410 to S420 correspond to the process as the fuse cutoff information storage section.

Fourth Embodiment

Hereinafter, the fourth embodiment of the present disclosure will be described with reference to the drawings. In the fourth embodiment, components different from the third embodiment will be described. Common configurations are denoted by the same reference numerals.

The communication system 1 of the fourth embodiment is different from that of the third embodiment in that the advance notification process is executed without executing the advance storage process. Next, a procedure of the advance notification process executed by the control section 11 of the master ECU 2 will be described. The advance notification process is a process repeatedly executed during activation of the master ECU 2.

Figure 11:
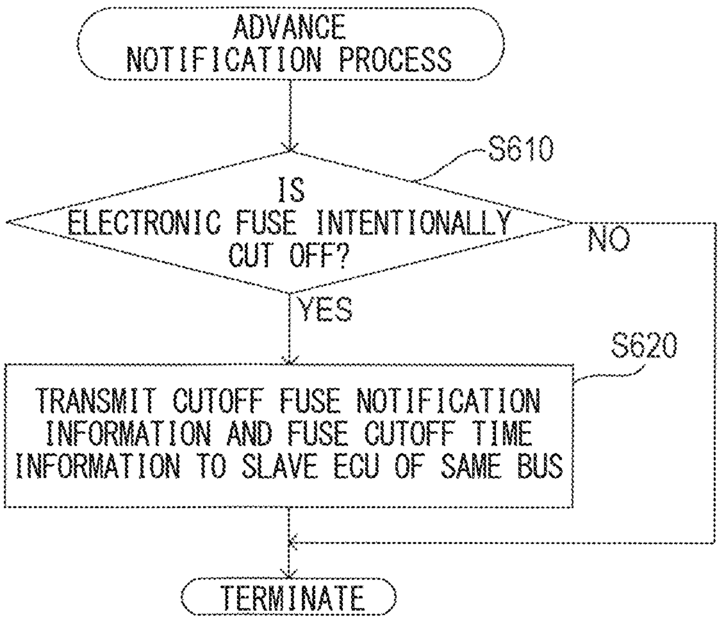
FIG. 11 is a flowchart illustrating an advance notification process according to the fourth embodiment.

When the advance notification process of the fourth embodiment is executed, in S610, the CPU 21 of the control section 11 determines whether the electronic fuse is intentionally cut off as illustrated in FIG. 11. Here, in a case where the electronic fuse is not intentionally cut off, the CPU 21 terminates the advance notification process. On the other hand, in a case where the electronic fuse is intentionally cut off, in S620, the CPU 21 transmits, to all the slave ECUs included in the communication system 1, cutoff fuse notification information for making a notification of the electronic fuse to be cut off and fuse cutoff time information indicating the time when the electronic fuse is cut off, and terminates the advance notification process. The process of S620 is performed before the electronic fuse is intentionally cut off. The master ECU 2 may transmit cutoff ECU notification information for making a notification of the slave ECU connected to the electronic fuse to be cut off instead of the cutoff fuse notification information.

Upon receiving the cutoff fuse notification information and the fuse cutoff time information, the slave ECUs 3 and 4 store the cutoff fuse notification information and the fuse cutoff time information in the storage section 33. Next, a procedure of the interruption diagnostic invalidation process executed by the control section 31 of the slave ECUs 3 and 4 will be described. The interruption diagnostic invalidation process is a process repeatedly executed during activation of the slave ECUs 3 and 4.

Figure 12:
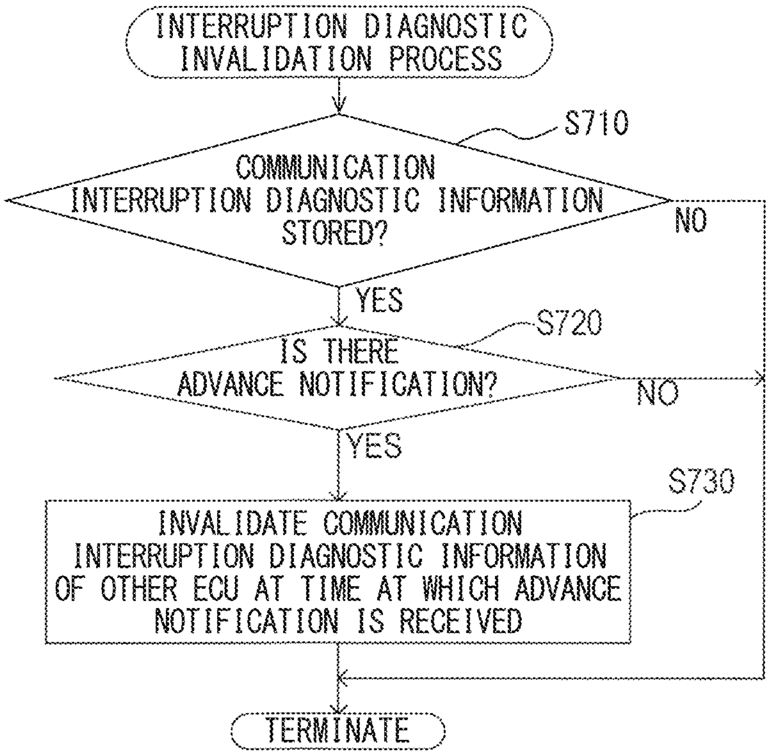
FIG. 12 is a flowchart illustrating an interruption diagnostic invalidation process according to the fourth embodiment.

When the interruption diagnostic invalidation process is executed, in S710, the CPU 41 of the control section 31 determines whether the communication interruption diagnostic information of another node is stored in the storage section 33 as illustrated in FIG. 12. Here, in a case where the communication interruption diagnostic information of another node is not stored, the CPU 41 terminates the interruption diagnostic invalidation process.

On the other hand, in a case where the communication interruption diagnostic information of another node is stored, in S720, the CPU 41 determines whether the cutoff fuse notification information indicating the electronic fuse connected to another node corresponding to the stored communication interruption diagnostic information has been received. The slave ECUs 3 and 4 store a table that specifies the correspondence relationship between the electronic fuse and the ECU connected to the electronic fuse.

Here, in a case where the cutoff fuse notification information indicating the electronic fuse connected to another node has not been received, the CPU 41 terminates the interruption diagnostic invalidation process. On the other hand, in a case where the cutoff fuse notification information indicating the electronic fuse connected to another node is received, in S730, the CPU 41 invalidates the interruption diagnostic information related to the slave ECU connected to the electronic fuse indicated by the cutoff fuse notification information near the time (fuse cutoff time) indicated by the fuse cutoff time information received together with the cutoff fuse notification information, and terminates the interruption diagnostic invalidation process. For example, in a case where the cutoff fuse notification information indicates the electronic fuse 15, the CPU 41 invalidates the interruption diagnostic information that occurs at a time near the fuse cutoff time and is related to the slave ECU 3.

The vicinity of the fuse cutoff time may be a period from a time T11 before the fuse cutoff time to a time T12 after the fuse cutoff time. The vicinity of the fuse cutoff time may also be a period from the fuse cutoff time T13 to a time T14 after a preset invalidation time from the time T13.

The communication system 1 configured as described above includes the slave ECU 3, the slave ECU 4, the master ECU 2, the control section 11, and the storage section 33 of the slave ECU 4. The storage section 33 of the slave ECU 4 is configured to store communication interruption diagnostic information related to communication with the slave ECU 3.

The storage section 33 of the slave ECU 4 is configured to store the cutoff fuse notification information, which is information referred to for invalidating the communication interruption diagnostic information. Such a communication system 1 can determine whether to invalidate the communication interruption diagnostic information related to communication with the slave ECU 3 by referring to the cutoff fuse notification information stored in the storage section 33 of the slave ECU 4. Therefore, in the communication system 1, it is possible to suppress occurrence of an event in which it is determined that an abnormality related to communication has occurred in the slave ECU 3 although no abnormality related to communication has occurred in the slave ECU 3 due to the electronic fuse 15 being switched to the off state. As a result, the communication system 1 can improve the abnormality detection accuracy.

Further, the master ECU 2 is configured to transmit, to the slave ECU 4, cutoff fuse notification information (hereinafter, first cutoff fuse notification information) for making a notification of the electronic fuse 15 to be cut off and fuse cutoff time information (hereinafter, first fuse cutoff time information) indicating a time when the electronic fuse 15 is cut off after turning off the electronic fuse 15 in order to cut off a power supply from the battery 5 to the slave ECU 3.

The master ECU 2 is configured to transmit, to the slave ECU 3, cutoff fuse notification information (hereinafter, second cutoff fuse notification information) for making a notification of the electronic fuse 16 to be cut off and fuse cutoff time information (hereinafter, second fuse cutoff time information) indicating a time when the electronic fuse 16 is cut off after turning off the electronic fuse 16 in order to cut off a power supply from the battery 5 to the slave ECU 4.

In such a communication system 1, in a case where the power supply to the slave ECUs 3 and 4 is cut off due to the master ECU 2 turning off the electronic fuses 15 and 16, the master ECU 2 transmits the first and second cutoff fuse notification information and the first and second fuse cutoff time information to the slave ECUs 4 and 3. That is, the communication system 1 can determine whether the master ECU 2 intentionally turns off the electronic fuses 16 and 15 based on whether the slave ECUs 3 and 4 store the second and first cutoff fuse notification information and the second and first fuse cutoff time information, respectively. Therefore, in the communication system 1, even in a case where communication from the slave ECUs 3 and 4 is interrupted due to the master ECU 2 intentionally turning off the electronic fuses 15 and 16, in a case where the slave ECUs 4 and 3 store the first and second cutoff fuse notification information and the first and second fuse cutoff time information, it can be considered that no communication interruption abnormality has occurred near the time indicated by the first and second fuse cutoff time in the slave ECUs 3 and 4. That is, the communication system 1 can suppress occurrence of an event in which it is determined that an abnormality of communication interruption has occurred in the slave ECUs 3 and 4 although no abnormality has occurred in the slave ECUs 3 and 4. As a result, the communication system 1 can improve the abnormality detection accuracy.

In the embodiment described above, S610 to S620 correspond to the process as the cutoff notification transmission section, and the storage section 33 of the slave ECU 4 corresponds to the state information storage section.

Fifth Embodiment

Hereinafter, the fifth embodiment of the present disclosure will be described with reference to the drawings. In the fifth embodiment, components different from the third embodiment will be described. Common configurations are denoted by the same reference numerals.

The communication system 1 of the fifth embodiment is different from that of the third embodiment in that the interruption diagnostic invalidation process is executed instead of the diagnostic invalidation process, and the response process is executed instead of the advance storage process.

Next, a procedure of the interruption diagnostic invalidation process executed by the control section 31 of the slave ECUs 3 and 4 will be described. The interruption diagnostic invalidation process is a process repeatedly executed during activation of the slave ECUs 3 and 4.

Figure 13:
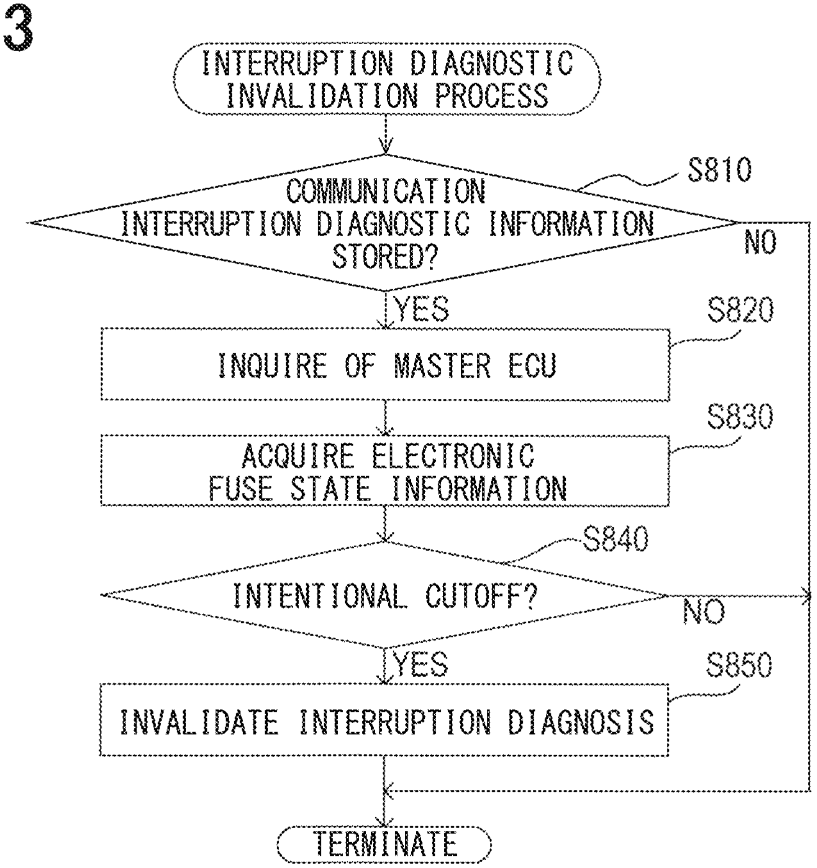
FIG. 13 is a flowchart illustrating an interruption diagnostic invalidation process according to the fifth embodiment.

When the interruption diagnostic invalidation process is executed, in S810, the CPU 41 of the control section 31 determines whether the communication interruption diagnostic information of another node is stored in the storage section 33 as illustrated in FIG. 13. Here, in a case where the communication interruption diagnostic information of another node is not stored, the CPU 41 terminates the interruption diagnostic invalidation process.

On the other hand, in a case where the communication interruption diagnostic information of another node is stored, in S820, the CPU 41 inquires of the master ECU 2 about the state of the electronic fuse. Specifically, the CPU 41 transmits, to the master ECU 2, a status checking request inquiring about the state of the electronic fuse connected to the slave ECU corresponding to the communication interruption diagnostic information determined in S810. For example, in a case where the slave ECU 3 stores communication interruption diagnostic information of the slave ECU 4, the slave ECU 3 transmits, to the master ECU 2, a status checking request for inquiring about the state of the electronic fuse 16.

In S830, the CPU 41 acquires electronic fuse state information from the master ECU 2. The electronic fuse state information indicates whether each of the electronic fuses 15 and 16 is in an on state or an off state, and whether it is an intended cutoff in a case where it is in the off state.

In S840, based on the acquired electronic fuse state information, the CPU 41 determines whether an electronic fuse connected to another node corresponding to the stored communication interruption diagnostic information has been intentionally cut off. Here, in a case where it has not been intentionally cut off, the CPU 41 terminates the interruption diagnostic invalidation process.

On the other hand, in the case where it has been intentionally cut off, in S850, the CPU 41 invalidates the communication interruption diagnostic information determined in S810, and terminates the interruption diagnostic invalidation process. Next, a procedure of the response process executed by the control section 11 of the master ECU 2 will be described. The response process is a process repeatedly executed during activation of the master ECU 2.

Figure 14:
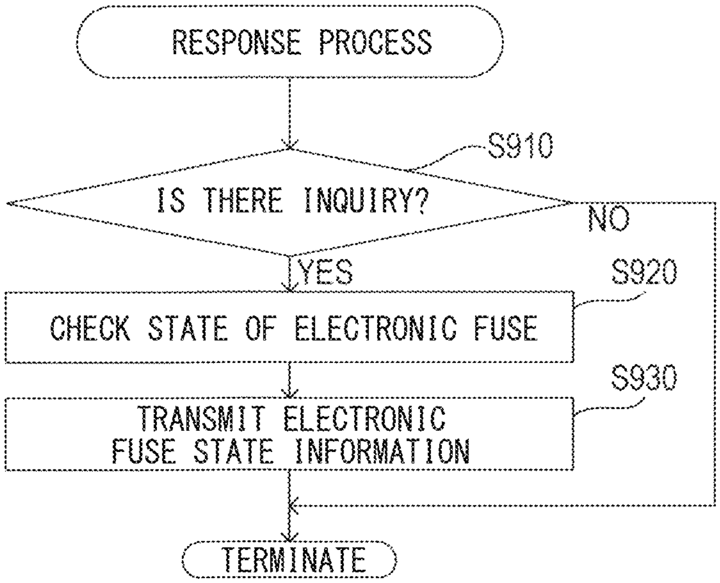
FIG. 14 is a flowchart illustrating a response process according to the fifth embodiment.

When the response process is executed, in S910, the CPU 21 of the control section 11 determines whether there is an inquiry from the slave ECU 3 or 4 as illustrated in FIG. 14. Here, in a case where there is no inquiry from the slave ECU 3 or 4, the CPU 21 terminates the response process.

On the other hand, in a case where there is an inquiry from the slave ECU 3 or the slave ECU 4, in S920, the CPU 21 checks the states of the electronic fuses 15 and 16. That is, the CPU 21 checks whether each of the electronic fuses 15 and 16 is in the on state or the off state, and whether each of the electronic fuses is intentionally cutoff in a case of the off state.

In S930, the CPU 21 generates electronic fuse state information based on the checking result in S920, transmits the generated electronic fuse state information to the inquired slave ECUs 3 and 4, and terminates the response process.

The communication system 1 configured as described above includes the slave ECU 3, the slave ECU 4, and the master ECU 2. The storage section 33 of the slave ECU 4 is configured to store diagnostic information related to communication with the slave ECU 3.

The storage section 33 of the slave ECU 4 is configured to store the electronic fuse state information, which is information referred to for invalidating the diagnostic information and indicating the checking result. Such a communication system 1 can determine whether to invalidate the diagnostic information related to communication with the slave ECU 3 by referring to the electronic fuse state information stored in the storage section 33 of the slave ECU 4. Therefore, in the communication system 1, it is possible to suppress occurrence of an event in which it is determined that an abnormality related to communication has occurred in the slave ECU 3 although no abnormality related to communication has occurred in the slave ECU 3 due to the electronic fuse 15 being switched to the off state. As a result, the communication system 1 can improve the abnormality detection accuracy.

Further, the slave ECU 3 is configured to transmit a status checking request (hereinafter, second status checking request) inquiring about a state of the electronic fuse 16 to the master ECU 2 when storing communication interruption diagnostic information (hereinafter, second communication interruption diagnostic information) indicating that communication with the slave ECU 4 is interrupted.

The slave ECU 4 is configured to transmit a status checking request (hereinafter, first status checking request) inquiring about a state of the electronic fuse 15 to the master ECU 2 when storing communication interruption diagnostic information (hereinafter, first communication interruption diagnostic information) indicating that communication with the slave ECU 3 is interrupted.

When acquiring the second status checking request from the slave ECU 3, the master ECU 2 checks the state of the electronic fuse 16 to transmit electronic fuse state information (hereinafter, second electronic fuse state information) indicating a checking result to the slave ECU 3.

When acquiring the first status checking request from the slave ECU 4, the master ECU 2 checks the state of the electronic fuse 15 to transmit electronic fuse state information (hereinafter, first electronic fuse state information) indicating a checking result to the slave ECU 4.

In such a communication system 1, the master ECU 2 transmits the second and first electronic fuse state information to the slave ECUs 3 and 4 in a case where the slave ECUs 3 and 4 store the second and first communication interruption diagnostic information, respectively. Therefore, in the communication system 1, the slave ECUs 3 and 4 can determine, based on the second and first electronic fuse state information, whether power supply to the slave ECUs 4 and 3 is cut off due to the master ECU 2 turning off the electronic fuses 16 and 15. In a case where it is determined that the power supply to the slave ECUs 4 and 3 is cut off due to the master ECU 2 turning off the electronic fuses 16 and 15, even in a case where the slave ECUs 3 and 4 store the second and first communication interruption diagnostic information, respectively, it can be considered that no communication interruption abnormality has occurred in the slave ECUs 4 and 3. That is, the communication system 1 can suppress occurrence of an event in which it is determined that an abnormality of communication interruption has occurred in the slave ECUs 3 and 4 although no abnormality has occurred in the slave ECUs 3 and 4. As a result, the communication system 1 can improve the abnormality detection accuracy.

In the embodiment described above, the storage section 33 of the slave ECU 4 corresponds to the diagnostic information storage section, the storage section 33 of the slave ECU 4 corresponds to the state information storage section, S820 corresponds to the process as the first request section and the second request section, and S910 to S930 correspond to the process as the response section.

Sixth Embodiment

Hereinafter, the sixth embodiment of the present disclosure will be described with reference to the drawings. In the sixth embodiment, components different from the first embodiment will be described. Common configurations are denoted by the same reference numerals.

Figure 16:
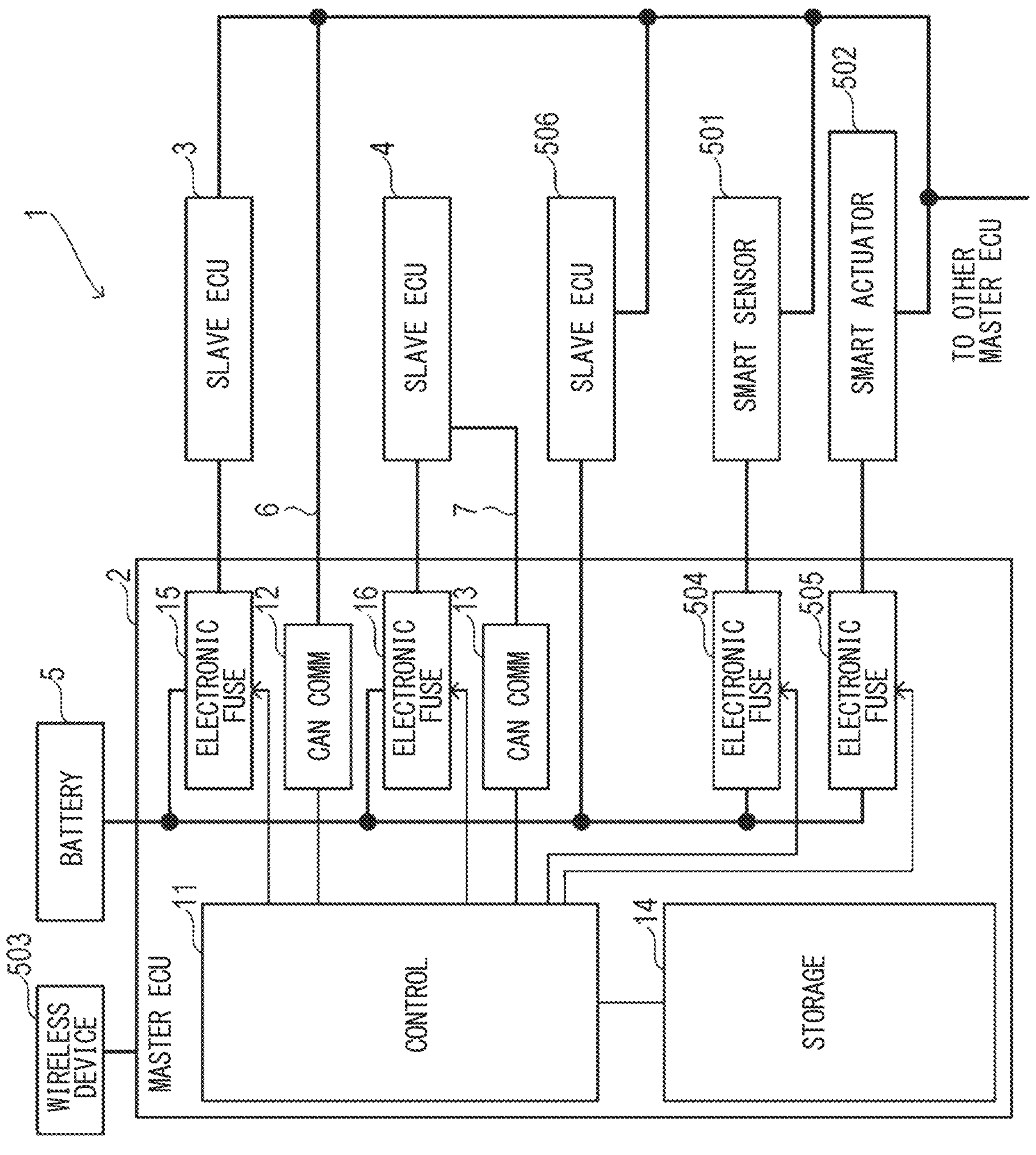
FIG. 16 is a block diagram illustrating a configuration of a communication system according to the sixth embodiment.

As illustrated in FIG. 16, the communication system 1 of the sixth embodiment is different from that of the first embodiment in that a smart sensor 501, a smart actuator 502, a wireless device 503, electronic fuses 504 and 505, and a slave ECU 506 are added.

The smart sensor 501 is a sensor with a communication function. The smart sensor 501 is connected to the communication bus 6. The smart actuator 502 is an actuator with a communication function. The smart actuator 502 is connected to the communication bus 6.

The wireless device 503 is a wireless communication device for performing wireless communication with an external communication device installed outside the vehicle. The wireless device 503 is, for example, a DCM. DCM stands for Data Communication Module.

The electronic fuse 504 is disposed on a power supply path between the battery 5 and the smart sensor 501. The electronic fuse 505 is disposed on a power supply path between the battery 5 and the smart actuator 502.

Each of the electronic fuses 504 and 505 is configured to switch between a conduction state in which the power supply path is conducted and a cutoff state in which the power supply path is cut off in accordance with a command from the control section 11.

Hereinafter, the master ECU 2, the slave ECUs 3 and 4, the smart sensor 501, the smart actuator 502, and the slave ECU 506 are collectively referred to as nodes.

(Prerequisite)

The master ECU 2 and the slave ECU 506 are always powered from the battery 5 without passing through an electronic fuse, and can switch to a wake-up state or a sleep state independently. Hereinafter, the master ECU 2 and the slave ECU 506 are also referred to as NM-equipped nodes. An NM-equipped node is a node having a function of generating an NM frame.

The slave ECUs 3 and 4, the smart sensor 501, and the smart actuator 502 are powered through an electronic fuse and cannot switch to a wake-up state or a sleep state independently. That is, they transition to the wake-up state when the electronic fuse is turned on and transition to the sleep state when the electronic fuse is turned off. Hereinafter, the slave ECU 3, the slave ECU 4, the smart sensor 501, and the smart actuator 502 are also referred to as NM-non-equipped nodes. An NM-non-equipped node is a node that does not have a function of generating and interpreting an NM frame.

The NM-non-equipped node includes at least one of an actuator and a sensor in addition to an ECU having a control function. The power supply path of the NM-non-equipped node is connected to the electronic fuses 15, 16, 504, and 505 of the master ECU 2, respectively.

The NM-non-equipped node and the electronic fuse may be connected in a one-to-one relationship, or a plurality of NM-non-equipped nodes belonging to the same cluster (that is, a group activated simultaneously) may be connected under one electronic fuse.

The master ECU 2 and the NM-equipped nodes have a CAN communication section and can transmit and receive NM frames. The NM-equipped nodes determine whether to be in the wake-up state or the sleep state based on the NM frames transmitted and received via the communication bus.

The master ECU 2 turns on or off the electronic fuses 15, 16, 504, and 505 to which the NM-non-equipped nodes are connected based on the NM frames transmitted and received via the communication bus.

The payload (that is, data area) of the NM frame transmitted and received by the master ECU 2 and the NM-equipped nodes stores information indicating which cluster to activate in one or more bits.

One or more master ECUs (that is, ECUs with built-in electronic fuses) are mounted on the vehicle. As illustrated in FIG. 17, one or more nodes belonging to each cluster are predetermined by a system developer. It is possible to assign a cluster to each node, but a plurality of nodes can be registered in one cluster. When a bit corresponding to each cluster is active (that is, bit=1), the cluster wakes up. In the case of the master ECU, waking up means turning on the electronic fuse.

First Activation Example

The first activation example is an operation example in which a failure diagnosis of the slave ECU 3 is performed in response to a request from the cloud.

First, a connection request is made from a base station (that is, the cloud) to the wireless device 503 of the vehicle. Next, when the wireless device 503 determines that the connection is valid, it notifies the master ECU 2 of the event received from the cloud.

Next, the master ECU 2 determines a service of "failure diagnosis of the slave ECU 3" based on the event, and generates an NM frame in which the bit of the third cluster to which only the slave ECU 3 belongs is activated to activate the slave ECU 3.

Next, the master ECU 2 transmits the generated NM frame onto the communication buses 6 and 7. Since there is no NM-equipped node belonging to the third cluster on the communication buses 6 and 7, there is no change in the devices on the communication buses.

Next, the master ECU 2 executes processing based on the NM frame in the control section 11 as if the NM frame with the bit of the third cluster activated is received at the same time as the above. Next, when the control section 11 of the master ECU 2 determines a wake-up instruction to the third cluster, since the electronic fuse 15 is included in the third cluster, the electronic fuse 15 is turned on.

When the electronic fuse 15 is turned on, power is supplied to the downstream slave ECU 3 to activate it. The master ECU 2 waits for the slave ECU 3 to start up, requests a diagnostic code from the slave ECU 3, and transmits the response result from the slave ECU 3 to the base station via the wireless device 503.

Second Activation Example

The second activation example is an operation example in which a failure diagnosis of the slave ECU 506 is performed in response to a request from the cloud.

First, a connection request is made from a base station (that is, the cloud) to the wireless device 503 of the vehicle. Next, when the wireless device 503 determines that the connection is valid, it notifies the master ECU 2 of the event received from the cloud.

Next, the master ECU 2 determines a service of "failure diagnosis of the slave ECU 506" based on the event, and generates an NM frame in which the bit of the fourth cluster to which only the slave ECU 506 belongs is activated to activate the slave ECU 506.

Next, the master ECU 2 transmits the generated NM frame onto the communication buses 6 and 7. Since the slave ECU 506 is on the communication bus 6 as a node belonging to the fourth cluster, the slave ECU 506 wakes up.

Next, the master ECU 2 executes processing based on the NM frame in the control section 11 as if the NM frame with the bit of the fourth cluster activated is received at the same time as the above. Next, even if the control section 11 of the master ECU 2 determines a wake-up instruction to the fourth cluster based on the NM frame, since there is no corresponding electronic fuse in the fourth cluster, it is ignored.

When the slave ECU 506 is activated, the master ECU 2 requests a diagnostic code from the slave ECU 506 via the communication bus and transmits the response result from the slave ECU 506 to the base station via the wireless device 503.

Third Activation Example

The third activation example is an operation example in which a user activates remote air conditioning with a smartphone. First, the user instructs the in-vehicle air conditioner to turn on from the smartphone.

When the wireless device 503 receives the instruction signal from the smartphone and determines that the instruction signal is valid, it notifies the master ECU 2 of the event (that is, the instruction signal) received from the cloud.

The master ECU 2 determines an "air conditioning service" based on the event and generates an NM frame in which the second cluster is activated as the air conditioning cluster. The master ECU 2 periodically transmits the generated NM frame to the communication buses 6 and 7 until an air conditioner stop instruction is issued. To maintain the active state, the NM frame needs to be periodically transmitted. At the same time, the control section 11 of the master ECU 2 executes processing based on the NM frame.

When the NM frame with the second cluster activated appears on the communication bus 6, the slave ECU 506 (that is, the air conditioner ECU) belonging to the second cluster receives the NM frame and wakes up according to the received NM frame.

When the control section 11 of the master ECU 2 detects that the second cluster is active, it turns on the electronic fuse 504 and the electronic fuse 505 belonging to the second cluster. When the electronic fuses 504 and 505 are turned on, power is supplied to the smart sensor 501 (that is, a temperature sensor) and the smart actuator 502 (that is, a compressor).

As a result, power supply to the air conditioner ECU, the smart sensor 501, and the smart actuator 502 starts, and it becomes possible to turn on the in-vehicle air conditioner. When the user instructs the in-vehicle air conditioner to turn off from the smartphone, the master ECU 2 stops periodic transmission of the NM frame.

When the NM frame is interrupted, the slave ECU 506 transitions to the sleep state, and the master ECU 2 turns off the electronic fuses 504 and 505. As a result, the in-vehicle air conditioner stops.

Fourth Activation Example

The fourth activation example is an operation example in which the in-vehicle air conditioner is activated from the slave ECU 506. Since the slave ECU 506 is always supplied with power even when the vehicle is stopped, it can detect the input of a signal indicating that the activation switch connected to the slave ECU 506 is turned on and wake up even during sleep.

When the slave ECU 506 wakes up and confirms an input to be activated regarding the in-vehicle air conditioner, it generates an NM frame in which the bit corresponding to the second cluster is turned on. The slave ECU 506 transmits the generated NM frame via the CAN communication section 32. When the master ECU 2 receives this NM frame, the master ECU 2 turns on the electronic fuses 504 and 505 belonging to the second cluster.

When the activation switch of the in-vehicle air conditioner is turned off, the slave ECU 506 stops transmitting the NM frame and transitions to the sleep state after a while. When the NM frame is interrupted, the master ECU 2 turns off the electronic fuses 504 and 505 after a while and terminates the control.

In a case where the master ECU 2 determines that it is necessary to continue the control even after the transmission of the NM frame is stopped, the master ECU 2 transmits the NM frame with the bit corresponding to the second cluster turned on. As a result, the slave ECU 506, the smart sensor 501, and the smart actuator 502 can maintain activation until the transmission of the NM frame generated by the master ECU 2 is stopped.

Seventh Embodiment

Figure 18:
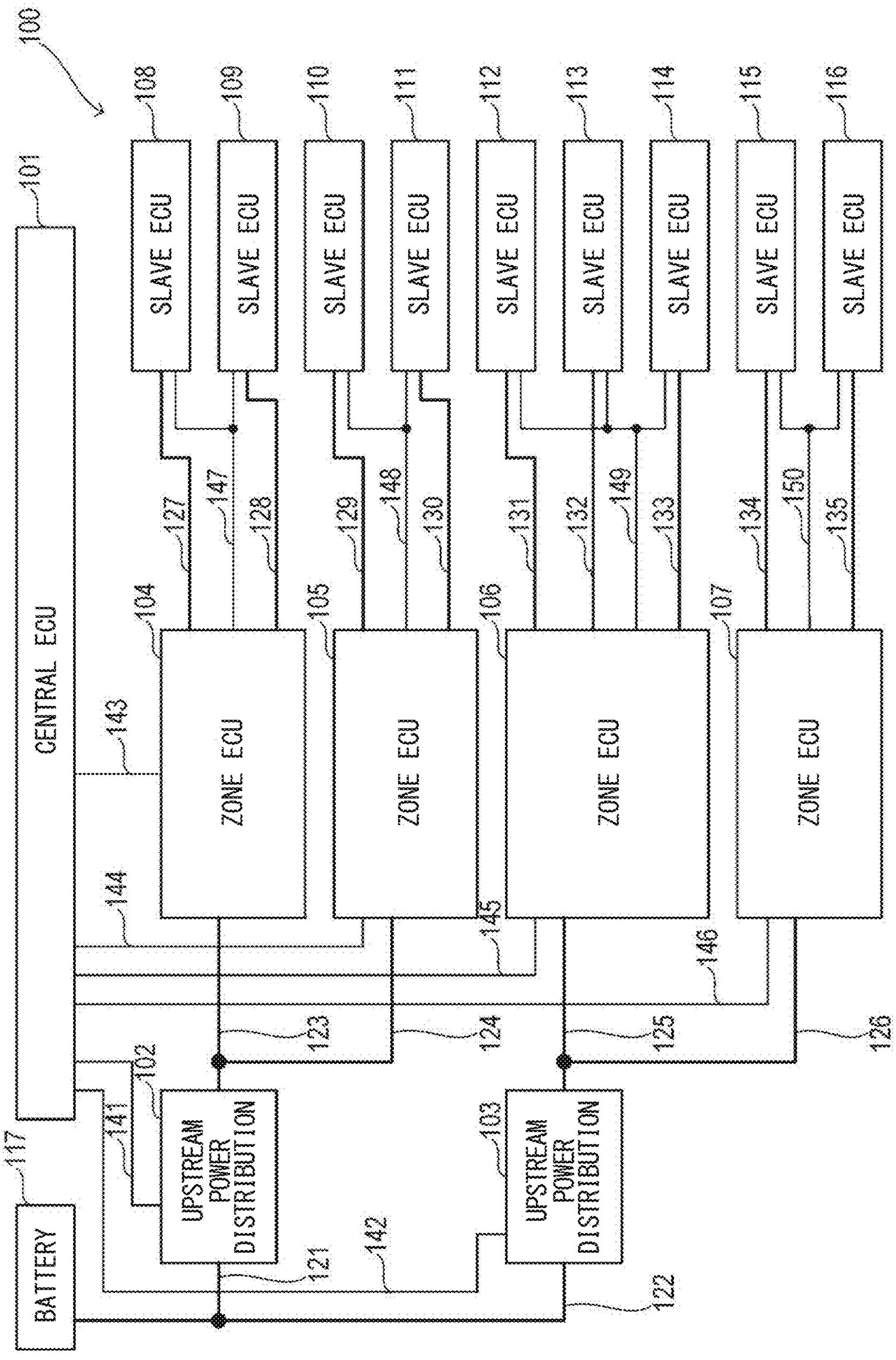
FIG. 18 is a block diagram illustrating a configuration of a communication system according to the seventh embodiment.

Hereinafter, the seventh embodiment of the present disclosure will be described with reference to the drawings. The communication system 100 of the seventh embodiment is mounted on a vehicle and includes a central ECU 101, upstream power distribution sections 102 and 103, zone ECUs 104, 105, 106, and 107, slave ECUs 108, 109, 110, 111, 112, 113, 114, 115, and 116, and a battery 117, as illustrated in FIG. 18. Hereinafter, the central ECU 101, the zone ECUs 104 to 107, and the slave ECUs 108 to 116 are collectively referred to as nodes.

The battery 117 supplies power to each section of the vehicle with a direct-current battery voltage (for example, 12 V). The central ECU 101, the upstream power distribution sections 102 and 103, the zone ECUs 104 to 107, and the slave ECUs 108 to 116 operate by receiving a power supply from the battery 117.

The upstream power distribution section 102 receives a power supply from the battery 117 via a power supply path 121 between the battery 117 and the upstream power distribution section 102. The upstream power distribution section 103 receives a power supply from the battery 117 via a power supply path 122 between the battery 117 and the upstream power distribution section 103.

The zone ECUs 104 and 105 each receive a power supply from the battery 117 via power supply paths 123 and 124 between the upstream power distribution section 102 and the zone ECUs 104 and 105, respectively.

The zone ECUs 106 and 107 each receive a power supply from the battery 117 via power supply paths 125 and 126 between the upstream power distribution section 103 and the zone ECUs 106 and 107, respectively.

The slave ECUs 108 and 109 each receive a power supply from the battery 117 via power supply paths 127 and 128 between the zone ECU 104 and the slave ECUs 108 and 109, respectively.

The slave ECUs 110 and 111 each receive a power supply from the battery 117 via power supply paths 129 and 130 between the zone ECU 105 and the slave ECUs 110 and 111, respectively.

The slave ECUs 112, 113, and 114 each receive a power supply from the battery 117 via power supply paths 131, 132, and 133 between the zone ECU 106 and the slave ECUs 112, 113, and 114, respectively.

The slave ECUs 115 and 116 each receive a power supply from the battery 117 via power supply paths 134 and 135 between the zone ECU 107 and the slave ECUs 115 and 116, respectively.

The central ECU 101 and the upstream power distribution section 102 are data-communicably connected to each other via a communication line 141. The central ECU 101 and the upstream power distribution section 103 are data-communicably connected to each other via a communication line 142.

The central ECU 101 and the zone ECUs 104, 105, 106, and 107 are data-communicably connected to each other via communication lines 143, 144, 145, and 146, respectively.

The zone ECU 104 and the slave ECUs 108 and 109 are data-communicably connected to each other via a communication bus 147. The zone ECU 105 and the slave ECUs 110 and 111 are data-communicably connected to each other via a communication bus 148.

The zone ECU 106 and the slave ECUs 112, 113, and 114 are data-communicably connected to each other via a communication bus 149. The zone ECU 107 and the slave ECUs 115 and 116 are data-communicably connected to each other via a communication bus 150.

Figure 19:
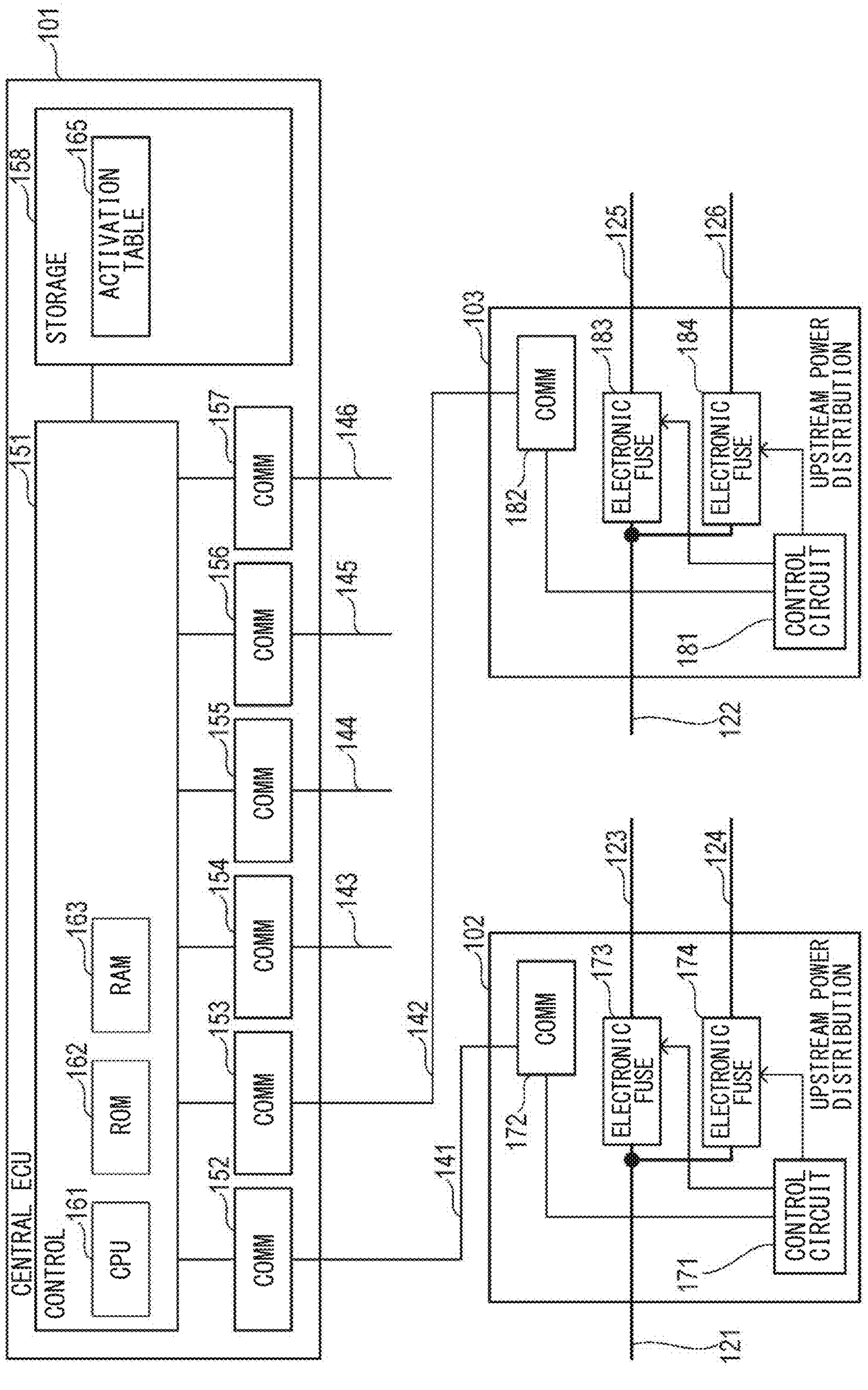
FIG. 19 is a block diagram illustrating a configuration of a central ECU and an upstream power distribution section according to the seventh embodiment.

As illustrated in FIG. 19, the central ECU 101 includes a control section 151, communication sections 152, 153, 154, 155, 156, and 157, and a storage section 158. The control section 151 is an electronic control device mainly including a microcomputer including a CPU 161, a ROM 162, a RAM 163, and the like. Various functions of the microcomputer are implemented by the CPU 161 executing a program stored in a non-transitory tangible recording medium. In this example, the ROM 162 corresponds to a non-transitory tangible recording medium storing a program. Further, by executing this program, a method corresponding to the program is executed. Some or all of the functions executed by the CPU 161 may be configured as hardware by one or a plurality of ICs or the like. Furthermore, the number of microcomputers constituting the control section 151 may be one or more.

The communication section 152 performs communication with the upstream power distribution section 102 connected to the communication line 141 by transmitting and receiving a communication frame based on, for example, the Ethernet communication protocol. Ethernet is a registered trademark.

The communication section 153 performs communication with the upstream power distribution section 103 connected to the communication line 142 by transmitting and receiving a communication frame based on, for example, the Ethernet communication protocol. The communication section 154 performs communication with the zone ECU 104 connected to the communication line 143 by transmitting and receiving a communication frame based on, for example, the Ethernet communication protocol.

The communication section 155 performs communication with the zone ECU 105 connected to the communication line 144 by transmitting and receiving a communication frame based on, for example, the Ethernet communication protocol. The communication section 156 performs communication with the zone ECU 106 connected to the communication line 145 by transmitting and receiving a communication frame based on, for example, the Ethernet communication protocol.

The communication section 157 performs communication with the zone ECU 107 connected to the communication line 145 by transmitting and receiving a communication frame based on, for example, the Ethernet communication protocol. The storage section 158 is a storage device for storing various pieces of data. The storage section 158 stores an activation table 165 to be described later.

The upstream power distribution section 102 includes a control circuit 171, a communication section 172, and electronic fuses 173 and 174. The control circuit 171 controls switching of the electronic fuses 173 and 174 between the on state and the off state based on instructions acquired from the central ECU 101 via the communication section 172.

The communication section 172 performs communication with the central ECU 101 connected to the communication line 141 by transmitting and receiving a communication frame based on, for example, the Ethernet communication protocol.

The electronic fuse 173 is disposed between the power supply path 121 and the power supply path 123. The electronic fuse 174 is disposed between the power supply path 121 and the power supply path 124. The upstream power distribution section 103 includes a control circuit 181, a communication section 182, and electronic fuses 183 and 184.

The control circuit 181 controls switching of the electronic fuses 183 and 184 between the on state and the off state based on instructions acquired from the central ECU 101 via the communication section 182.

The communication section 182 performs communication with the central ECU 101 connected to the communication line 142 by transmitting and receiving a communication frame based on, for example, the Ethernet communication protocol.

Figure 20:
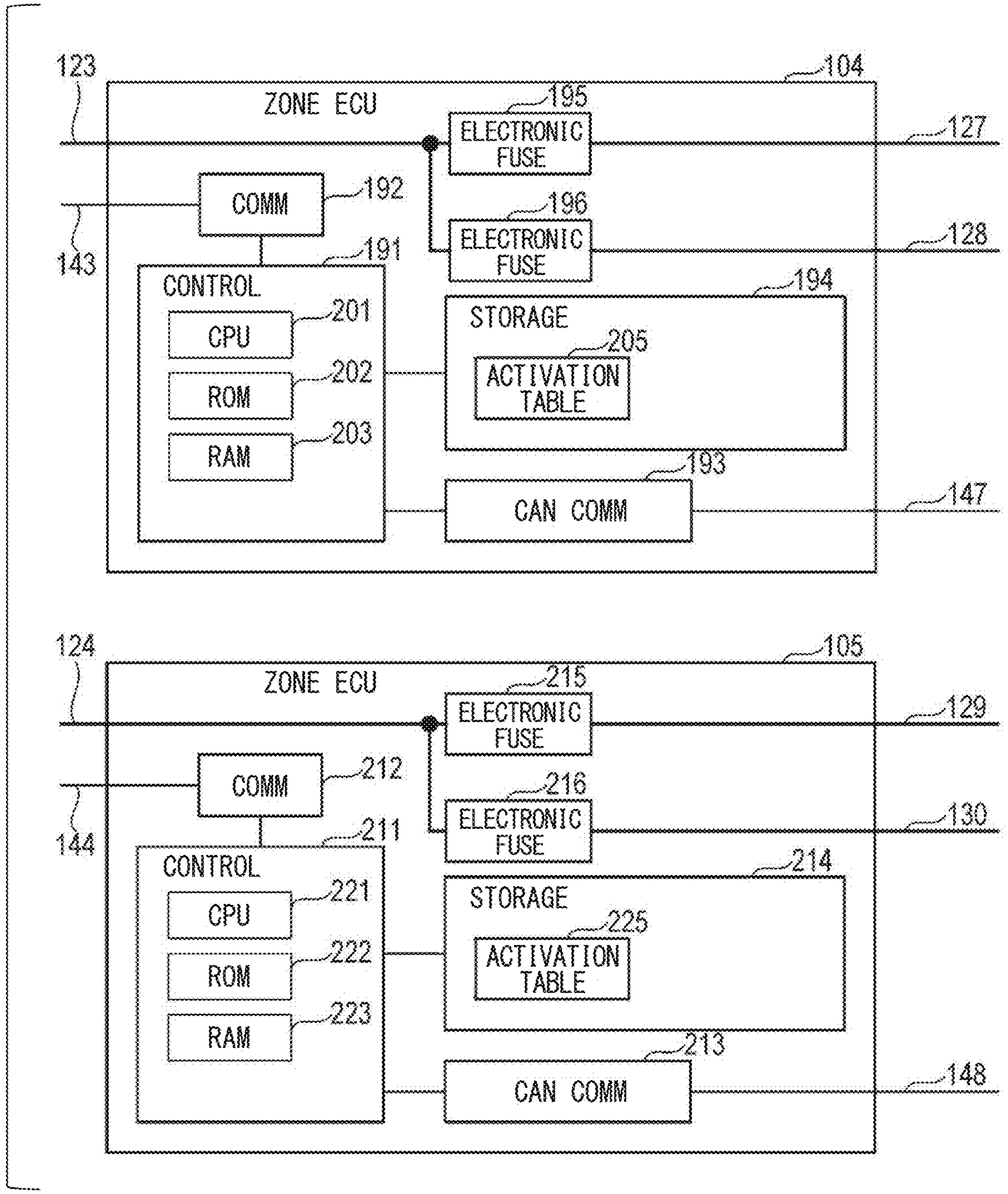
FIG. 20 is a first block diagram illustrating a configuration of a zone ECU according to the seventh embodiment.

The electronic fuse 183 is disposed between the power supply path 122 and the power supply path 125. The electronic fuse 184 is disposed between the power supply path 122 and the power supply path 126. As illustrated in FIG. 20, the zone ECU 104 includes a control section 191, a communication section 192, a CAN communication section 193, a storage section 194, and electronic fuses 195 and 196.

The control section 191 is an electronic control device mainly including a microcomputer including a CPU 201, a ROM 202, a RAM 203, and the like. Various functions of the microcomputer are implemented by the CPU 201 executing a program stored in a non-transitory tangible recording medium. In this example, the ROM 202 corresponds to a non-transitory tangible recording medium storing a program. Further, by executing this program, a method corresponding to the program is executed. Some or all of the functions executed by the CPU 201 may be configured as hardware by one or a plurality of ICs or the like. Furthermore, the number of microcomputers constituting the control section 191 may be one or more.

The communication section 192 performs communication with the central ECU 101 connected to the communication line 143 by transmitting and receiving a communication frame based on, for example, the Ethernet communication protocol.

The CAN communication section 193 performs communication with the slave ECUs 108 and 109 connected to the communication bus 147 by transmitting and receiving a communication frame based on the CAN communication protocol.

The storage section 194 is a storage device for storing various pieces of data. The storage section 194 stores an activation table 205 to be described later. The electronic fuse 195 is disposed between the power supply path 123 and the power supply path 127. The electronic fuse 196 is disposed between the power supply path 123 and the power supply path 128.

The zone ECU 105 includes a control section 211, a communication section 212, a CAN communication section 213, a storage section 214, and electronic fuses 215 and 216. The control section 211 is an electronic control device mainly including a microcomputer including a CPU 221, a ROM 222, a RAM 223, and the like. Various functions of the microcomputer are implemented by the CPU 221 executing a program stored in a non-transitory tangible recording medium. In this example, the ROM 222 corresponds to a non-transitory tangible recording medium storing a program. Further, by executing this program, a method corresponding to the program is executed. Some or all of the functions executed by the CPU 221 may be configured as hardware by one or a plurality of ICs or the like. Furthermore, the number of microcomputers constituting the control section 211 may be one or more.

The communication section 212 performs communication with the central ECU 101 connected to the communication line 144 by transmitting and receiving a communication frame based on, for example, the Ethernet communication protocol.

The CAN communication section 213 performs communication with the slave ECUs 110 and 111 connected to the communication bus 148 by transmitting and receiving a communication frame based on the CAN communication protocol.

The storage section 214 is a storage device for storing various pieces of data. The storage section 214 stores an activation table 225 to be described later. The electronic fuse 215 is disposed between the power supply path 124 and the power supply path 129. The electronic fuse 216 is disposed between the power supply path 124 and the power supply path 130.

Figure 21:
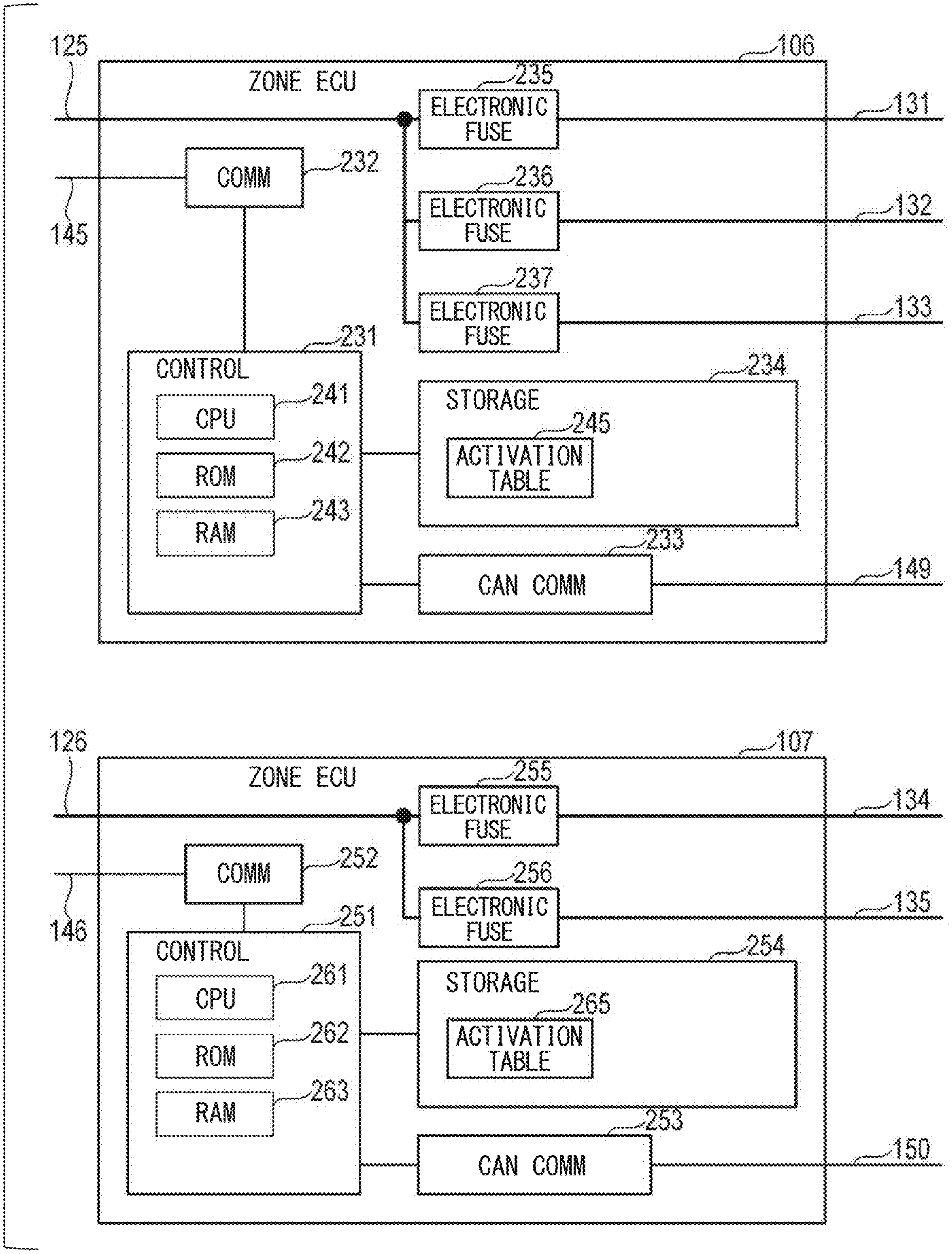
FIG. 21 is a second block diagram illustrating a configuration of a zone ECU according to the seventh embodiment.

As illustrated in FIG. 21, the zone ECU 106 includes a control section 231, a communication section 232, a CAN communication section 233, a storage section 234, and electronic fuses 235, 236, and 237. The control section 231 is an electronic control device mainly including a microcomputer including a CPU 241, a ROM 242, a RAM 243, and the like. Various functions of the microcomputer are implemented by the CPU 241 executing a program stored in a non-transitory tangible recording medium. In this example, the ROM 242 corresponds to a non-transitory tangible recording medium storing a program. Further, by executing this program, a method corresponding to the program is executed. Some or all of the functions executed by the CPU 241 may be configured as hardware by one or a plurality of ICs or the like. Furthermore, the number of microcomputers constituting the control section 231 may be one or more.

The communication section 232 performs communication with the central ECU 101 connected to the communication line 145 by transmitting and receiving a communication frame based on, for example, the Ethernet communication protocol.

The CAN communication section 233 performs communication with the slave ECUs 112, 113, and 114 connected to the communication bus 149 by transmitting and receiving a communication frame based on the CAN communication protocol.

The storage section 234 is a storage device for storing various pieces of data. The storage section 234 stores an activation table 245 to be described later. The electronic fuse 235 is disposed between the power supply path 125 and the power supply path 131. The electronic fuse 236 is disposed between the power supply path 125 and the power supply path 132. The electronic fuse 237 is disposed between the power supply path 125 and the power supply path 133.

The zone ECU 107 includes a control section 251, a communication section 252, a CAN communication section 253, a storage section 254, and electronic fuses 255 and 256. The control section 251 is an electronic control device mainly including a microcomputer including a CPU 261, a ROM 262, a RAM 263, and the like. Various functions of the microcomputer are implemented by the CPU 261 executing a program stored in a non-transitory tangible recording medium. In this example, the ROM 262 corresponds to a non-transitory tangible recording medium storing a program. Further, by executing this program, a method corresponding to the program is executed. Some or all of the functions executed by the CPU 261 may be configured as hardware by one or a plurality of ICs or the like. Furthermore, the number of microcomputers constituting the control section 251 may be one or more.

The communication section 252 performs communication with the central ECU 101 connected to the communication line 146 by transmitting and receiving a communication frame based on, for example, the Ethernet communication protocol.

The CAN communication section 253 performs communication with the slave ECUs 115 and 116 connected to the communication bus 150 by transmitting and receiving a communication frame based on the CAN communication protocol.

The storage section 254 is a storage device for storing various pieces of data. The storage section 254 stores an activation table 265 to be described later. The electronic fuse 255 is disposed between the power supply path 126 and the power supply path 134. The electronic fuse 256 is disposed between the power supply path 126 and the power supply path 135.

Figure 22:
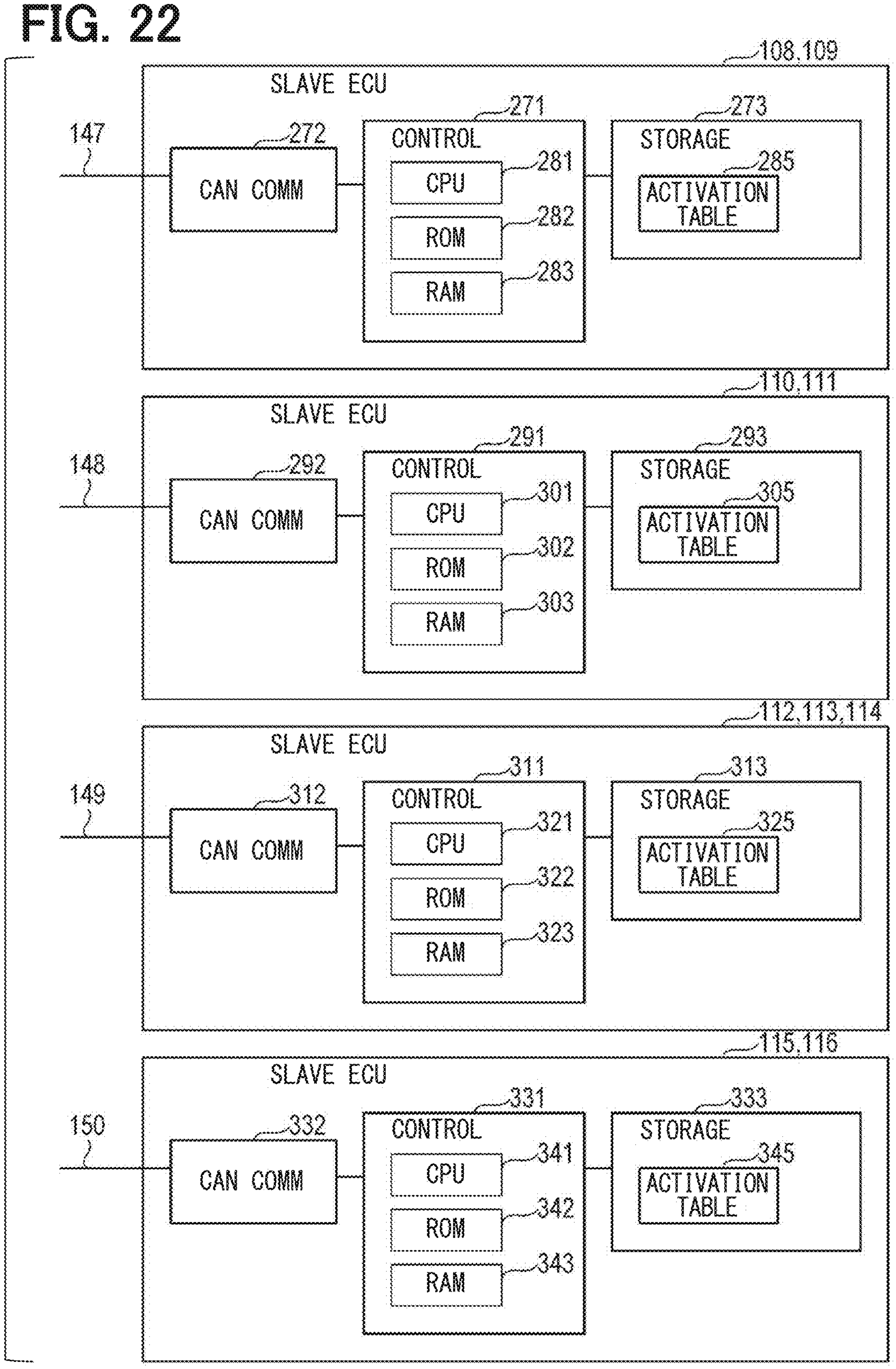
FIG. 22 is a block diagram illustrating a configuration of a slave ECU according to the seventh embodiment.

As illustrated in FIG. 22, the slave ECUs 108 and 109 include a control section 271, a CAN communication section 272, and a storage section 273. The control section 271 is an electronic control device mainly including a microcomputer including a CPU 281, a ROM 282, a RAM 283, and the like. Various functions of the microcomputer are implemented by the CPU 281 executing a program stored in a non-transitory tangible recording medium. In this example, the ROM 282 corresponds to a non-transitory tangible recording medium storing a program. Further, by executing this program, a method corresponding to the program is executed. Some or all of the functions executed by the CPU 281 may be configured as hardware by one or a plurality of ICs or the like. Furthermore, the number of microcomputers constituting the control section 271 may be one or more.

The CAN communication section 272 performs communication with the zone ECU 104 connected to the communication bus 147 based on the CAN communication protocol. The storage section 273 is a storage device for storing various pieces of data. The storage section 273 stores an activation table 285 to be described later.

The slave ECUs 110 and 111 include a control section 291, a CAN communication section 292, and a storage section 293. The control section 291 is an electronic control device mainly including a microcomputer including a CPU 301, a ROM 302, a RAM 303, and the like. Various functions of the microcomputer are implemented by the CPU 301 executing a program stored in a non-transitory tangible recording medium. In this example, the ROM 302 corresponds to a non-transitory tangible recording medium storing a program. Further, by executing this program, a method corresponding to the program is executed. Some or all of the functions executed by the CPU 301 may be configured as hardware by one or a plurality of ICs or the like. Furthermore, the number of microcomputers constituting the control section 291 may be one or more.

The CAN communication section 292 performs communication with the zone ECU 105 connected to the communication bus 148 based on the CAN communication protocol. The storage section 293 is a storage device for storing various pieces of data. The storage section 293 stores an activation table 305 to be described later.

The slave ECUs 112, 113, and 114 include a control section 311, a CAN communication section 312, and a storage section 313. The control section 311 is an electronic control device mainly including a microcomputer including a CPU 321, a ROM 322, a RAM 323, and the like. Various functions of the microcomputer are implemented by the CPU 321 executing a program stored in a non-transitory tangible recording medium. In this example, the ROM 322 corresponds to a non-transitory tangible recording medium storing a program. Further, by executing this program, a method corresponding to the program is executed. Some or all of the functions executed by the CPU 321 may be configured as hardware by one or a plurality of ICs or the like. Furthermore, the number of microcomputers constituting the control section 311 may be one or more.

The CAN communication section 312 performs communication with the zone ECU 106 connected to the communication bus 149 based on the CAN communication protocol. The storage section 313 is a storage device for storing various pieces of data. The storage section 313 stores an activation table 325 to be described later.

The slave ECUs 115 and 116 include a control section 331, a CAN communication section 332, and a storage section 333. The control section 331 is an electronic control device mainly including a microcomputer including a CPU 341, a ROM 342, a RAM 343, and the like. Various functions of the microcomputer are implemented by the CPU 341 executing a program stored in a non-transitory tangible recording medium. In this example, the ROM 342 corresponds to a non-transitory tangible recording medium storing a program. Further, by executing this program, a method corresponding to the program is executed. Some or all of the functions executed by the CPU 341 may be configured as hardware by one or a plurality of ICs or the like. Furthermore, the number of microcomputers constituting the control section 331 may be one or more.

The CAN communication section 332 performs communication with the zone ECU 107 connected to the communication bus 150 based on the CAN communication protocol. The storage section 333 is a storage device for storing various pieces of data. The storage section 333 stores an activation table 345 to be described later.

The activation tables 165, 205, 225, 245, 265, 285, 305, 325, and 345 specify a communication group (that is, an activation group) to be activated for each event.

The activation table 205 of the zone ECU 104 further specifies a correspondence relationship between the activation group and the electronic fuses 195 and 196 built into the zone ECU 104 to be turned on.

The activation table 225 of the zone ECU 105 further specifies a correspondence relationship between the activation group and the electronic fuses 215 and 216 built into the zone ECU 105 to be turned on.

The activation table 245 of the zone ECU 106 further specifies a correspondence relationship between the activation group and the electronic fuses 235, 236, and 237 built into the zone ECU 106 to be turned on.

The activation table 265 of the zone ECU 107 further specifies a correspondence relationship between the activation group and the electronic fuses 255 and 256 built into the zone ECU 107 to be turned on.

When the zone ECUs 104, 105, 106, and 107 receive an NM frame, they refer to the activation tables 205, 225, 245, and 265 based on the activation group indicated by the NM frame to turn on or off the electronic fuses under their control.

The slave ECUs 108 to 116 execute a process corresponding to the interruption diagnostic invalidation process of the fifth embodiment. That is, when the slave ECUs 108 to 116 store communication interruption diagnostic information of another node, they inquire about the state of the electronic fuses to all the zone ECUs 104 to 107.

When the zone ECUs 104 to 107 receive an inquiry from the slave ECUs 108 to 116, they check the state of the electronic fuses under their control. The zone ECUs 104 to 107 generate electronic fuse state information based on the checking result and transmit the generated electronic fuse state information to the inquiring slave ECUs 108 to 116.

The slave ECUs 108 to 116 determine whether the electronic fuses connected to another node corresponding to the stored communication interruption diagnostic information have been intentionally cut off based on the electronic fuse state information acquired from the zone ECUs 104 to 107. If the cutoff is intentional, the slave ECUs 108 to 116 invalidate the communication interruption diagnostic information.

In the embodiment described above, the electronic fuse 195 corresponds to the first electronic fuse, the battery 117 corresponds to the power source, the slave ECU 108 corresponds to the first control device, the electronic fuse 196 corresponds to the second electronic fuse, and the slave ECU 109 corresponds to the second control device.

Further, the central ECU 101 corresponds to the management device, the control section 151 corresponds to the switching control section, the storage section 273 of the slave ECU 109 corresponds to the diagnostic information storage section, and the storage section 273 of the slave ECU 109 corresponds to the state information storage section.

Eighth Embodiment

Hereinafter, the eighth embodiment of the present disclosure will be described with reference to the drawings. In the eighth embodiment, components different from the seventh embodiment will be described. Common configurations are denoted by the same reference numerals.

In the communication system 100 of the eighth embodiment, the central ECU 101 executes a process corresponding to the advance notification process of the first embodiment. That is, in a case where there is an electronic fuse to be intentionally cut off (S10), the central ECU 101 transmits power supply cutoff notification information to the slave ECUs 108 to 116 connected to the electronic fuse to be intentionally cut off via the zone ECUs 104 to 107 as relays (S20).

When the slave ECUs 108 to 116 receive the power supply cutoff notification information, they store the received power supply cutoff notification information together with the reception date and time information indicating the date and time when the power supply cutoff notification information was received. When the slave ECUs 108 to 116 are activated and the power supply cutoff notification information is stored (S120), they store the power supply restoration date and time information (S130).

In the embodiment described above, the storage section 273 of the slave ECU 109 corresponds to the diagnostic information storage section, and the storage section 273 of the slave ECU 108 corresponds to the state information storage section.

Ninth Embodiment

Hereinafter, the ninth embodiment of the present disclosure will be described with reference to the drawings. In the ninth embodiment, components different from the seventh embodiment will be described. Common configurations are denoted by the same reference numerals.

In the communication system 100 of the ninth embodiment, the slave ECUs 108 to 116 execute a process corresponding to the notification checking process of the second embodiment. The slave ECUs 108 to 116 include a power storage section (not illustrated).

That is, when the power supply from the battery 117 is cut off (S210), the slave ECUs 108 to 116 check for the presence of the power supply cutoff notification information (S220), and when the power supply cutoff notification information is stored (S230), they store the slave cutoff information together with the slave cutoff time information (S240).

In the embodiment described above, the storage section 273 of the slave ECU 109 corresponds to the diagnostic information storage section, and the storage section 273 of the slave ECU 108 corresponds to the state information storage section.

Tenth Embodiment

Hereinafter, the tenth embodiment of the present disclosure will be described with reference to the drawings. In the tenth embodiment, components different from the seventh embodiment will be described. Common configurations are denoted by the same reference numerals.

In the communication system 100 of the tenth embodiment, the central ECU 101 executes a process corresponding to the advance storage process of the third embodiment. That is, in a case where there is an electronic fuse to be intentionally cut off (S410), the central ECU 101 stores the cutoff fuse notification information for making a notification of the electronic fuse to be cut off and the fuse cutoff time information indicating the time to cut off the electronic fuse in the storage section 158 (S420).

In the embodiment described above, the storage section 273 of the slave ECU 109 corresponds to the diagnostic information storage section, and the storage section 158 of the central ECU 101 corresponds to the state information storage section.

Eleventh Embodiment

Hereinafter, the eleventh embodiment of the present disclosure will be described with reference to the drawings. In the eleventh embodiment, components different from the seventh embodiment will be described. Common configurations are denoted by the same reference numerals.

In the communication system 100 of the eleventh embodiment, the central ECU 101 executes a process corresponding to the advance notification process of the fourth embodiment. That is, in a case where the electronic fuse is intentionally cut off (S610), the central ECU 101 transmits the cutoff fuse notification information for making a notification of the electronic fuse to be cut off and the fuse cutoff time information indicating the time to cut off the electronic fuse to all the slave ECUs 108 to 116 included in the communication system 100 (S620).

Further, the slave ECUs 108 to 116 execute a process corresponding to the interruption diagnostic invalidation process of the fourth embodiment. That is, when the slave ECUs 108 to 116 store the communication interruption diagnostic information of another node (S710) and receive the cutoff fuse notification information indicating the electronic fuse connected to another node (S720), they invalidate the interruption diagnostic information related to the slave ECU connected to the electronic fuse indicated by the cutoff fuse notification information near the fuse cutoff time (S730).

In the embodiment described above, the storage section 273 of the slave ECU 109 corresponds to the diagnostic information storage section, and the storage section 273 of the slave ECU 109 corresponds to the state information storage section. Although an embodiment of the present disclosure has been described above, the present disclosure is not limited to the above embodiment, and various modifications can be made.

(Modification 1)

Figure 15:
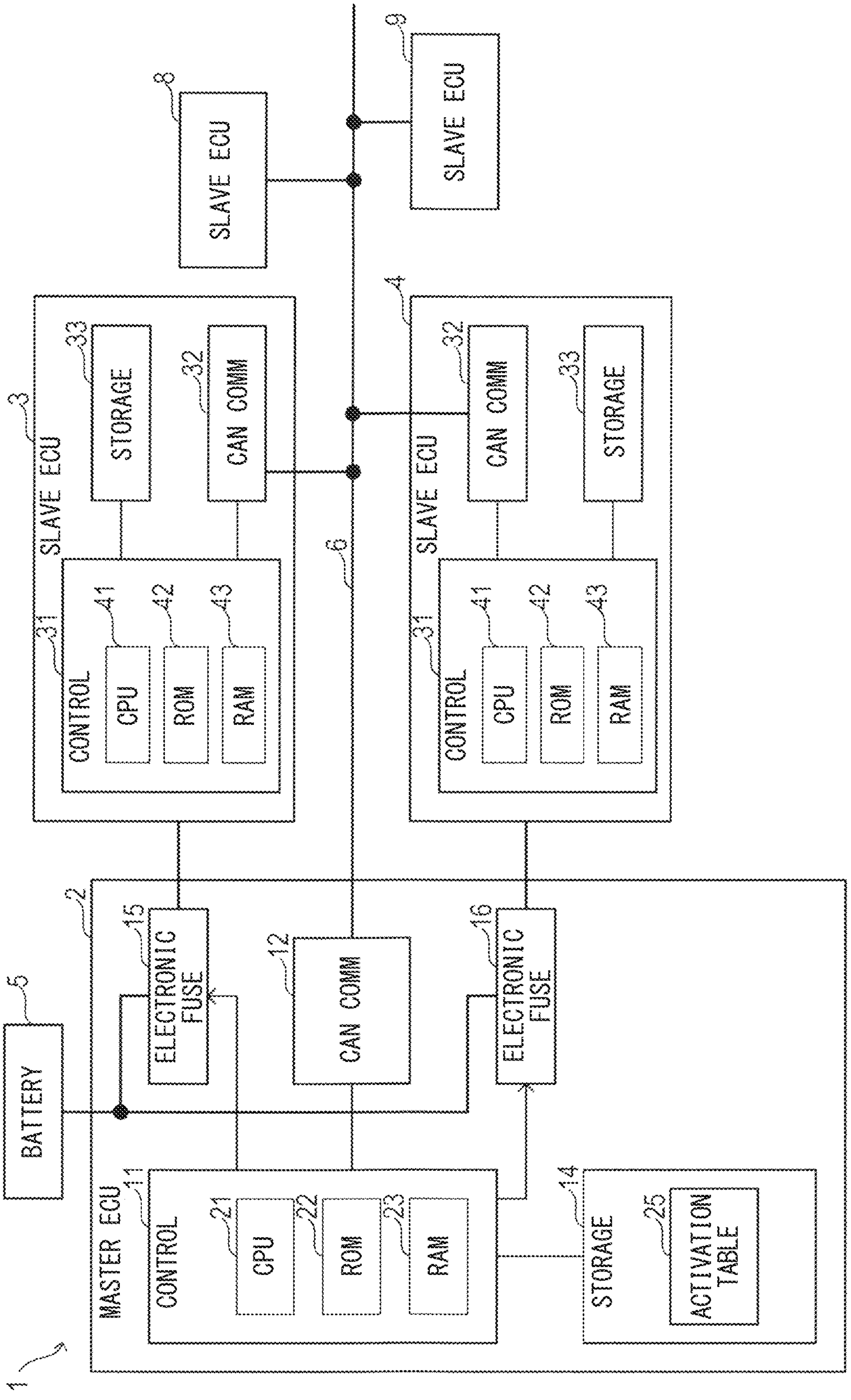
FIG. 15 is a block diagram illustrating a configuration of a communication system according to another embodiment.

In the third, fourth, and fifth embodiments, the mode in which the slave ECU 3 and the slave ECU 4 are connected to the communication bus 6 is described. However, as illustrated in FIG. 15, three or more ECUs may be connected to the communication bus 6. In FIG. 15, a slave ECU 8 and a slave ECU 9 in addition to the slave ECU 3 and the slave ECU 4 are connected to the communication bus 6.

In this case, the master ECU 2 according to the fourth embodiment may transmit the cutoff fuse notification information and the fuse cutoff time information to all the slave ECUs (that is, the slave ECUs 3, 4, 8, and 9) connected to the communication bus 6. As a result, in the communication system 1, not only the slave ECUs 3 and 4 but also the slave ECUs 8 and 9 can acquire the cutoff fuse notification information and the fuse cutoff time information. Therefore, not only the slave ECUs 3 and 4 but also the slave ECUs 8 and 9 can determine whether the master ECU 2 intentionally turns off the electronic fuses 15 and 16. As a result, in the communication system 1, it is possible to suppress occurrence of an event in which the slave ECUs 8 and 9 determine that an abnormality of communication interruption has occurred in the slave ECUs 3 and 4 although no abnormality has occurred in the slave ECUs 3 and 4. As a result, the communication system 1 can further improve the abnormality detection accuracy.

In addition, there may be a slave ECU connected to a communication bus (for example, communication bus 7 of FIG. 5) through which it is possible to communicate with the slave ECU 3 connected to the electronic fuse 15 via the master ECU 2. In this case, the master ECU 2 according to the fourth embodiment may transmit the cutoff fuse notification information and the fuse cutoff time information to all the slave ECUs connected to the communication bus through which it is possible to communicate with the slave ECU 3 connected to the electronic fuse 15 via the master ECU 2.

The master ECU 2 according to the fifth embodiment may transmit the electronic fuse state information to all the slave ECUs (that is, the slave ECUs 3, 4, 8, and 9) connected to the communication bus 6. As a result, the communication system 1 can reduce the frequency with which the slave ECUs 8 and 9 transmit the status checking request to the master ECU 2, and can reduce the usage rate (that is, the bus load) of the communication bus 6.

In addition, there may be a slave ECU connected to a communication bus (for example, communication bus 7 of FIG. 5) through which it is possible to communicate with the slave ECU 3 connected to the electronic fuse 15 via the master ECU 2. In this case, the master ECU 2 according to the fifth embodiment may transmit the electronic fuse state information to all the slave ECUs connected to the communication bus through which it is possible to communicate with the slave ECU 3 connected to the electronic fuse 15 via the master ECU 2.

(Modification 2)

In the embodiment described above, the mode in which an operator who performs a vehicle inspection connects the malfunction diagnosis device 600 to the master ECU 2 to acquire diagnostic information and the like is described. However, the malfunction diagnosis device 600 may be connected to the master ECU 2 by remote communication to acquire diagnostic information and the like, and then the diagnostic information may be invalidated.

(Modification 3)

In the fourth embodiment, the mode in which the cutoff fuse notification information and the fuse cutoff time information are transmitted after the electronic fuses 15 and 16 are cut off is described, but the cutoff fuse notification information and the fuse cutoff time information may be transmitted before the electronic fuses 15 and 16 are cut off.

(Modification 4)

In the first embodiment, the mode in which the power supply restoration date and time information is stored when the power supply cutoff notification information is stored is described. However, the slave ECUs 3 and 4 may store the power supply restoration date and time information when activated by the power supply from the battery 5 regardless of whether the power supply cutoff notification information is stored. As a result, in a case where both the power supply cutoff notification information and the power supply restoration date and time information are stored before and after the power supply restoration of the slave ECUs 3 and 4, it is possible to invalidate the diagnostic information related to the slave ECUs 3 and 4 from the reception date and time of the cutoff notification to the power supply restoration date and time.

(Modification 5)

In the second embodiment, the mode in which the slave cutoff information and the slave cutoff time information are stored when the power supply cutoff notification information is stored is described. However, the slave ECUs 3 and 4 may store the slave cutoff information and the slave cutoff time information when the power supply from the battery 5 is cut off regardless of whether the power supply cutoff notification information is stored. As a result, in a case where both the power supply cutoff notification information and the slave cutoff information are stored, it is possible to invalidate the diagnostic information related to the slave ECUs 3 and 4 that occurred at a time near the slave cutoff time.

(Modification 6)

In the embodiment described above, the first embodiment and the second embodiment are described separately. However, both the power supply restoration date and time information of the first embodiment and the slave cutoff time information of the second embodiment may be stored. As a result, it is possible to invalidate the diagnostic information from the time indicated by the slave cutoff time information to the date and time indicated by the power supply restoration date and time information.

(Modification 7)

In the fifth embodiment, the mode in which the slave ECUs 3 and 4 transmit the status checking request inquiring about the state of the electronic fuse connected to the slave ECU corresponding to the communication interruption diagnostic information to the master ECU 2 is described. However, the slave ECUs 3 and 4 may inquire about the ECU state indicating whether the power supply to the slave ECU corresponding to the communication interruption diagnostic information is cut off.

(Modification 8)

In the sixth embodiment, the mode in which the slave ECUs 108 to 116 inquire about the state of the electronic fuses to all the zone ECUs 104 to 107 is described. However, in a case where the zone ECUs 104 to 107 notify the central ECU 101 of the state of the electronic fuses under their control, the slave ECUs 108 to 116 may inquire about the state of the electronic fuses to the central ECU 101. The core ECU 101 centrally manages the state of the electronic fuses provided in the zone ECUs 104 to 107 based on the notifications from the zone ECUs 104 to 107. Therefore, the core ECU 101 can respond to the inquiry from the slave ECUs 108 to 116 with the state of the electronic fuses.

(Modification 9)

In the first and second embodiments, the mode in which the master ECU 2 transmits the power supply cutoff notification information to the slave ECUs 3 and 4 is described. However, as illustrated in the sixth embodiment, in a case where the communication system 100 includes the central ECU 101, the zone ECUs 104 to 107, and the slave ECUs 108 to 116, the zone ECUs 104 to 107 may transmit the power supply cutoff notification information to the slave ECUs 108 to 116 under their control.

(Modification 10)

In the third embodiment, the mode in which the master ECU 2 stores the cutoff fuse notification information for making a notification of the electronic fuse to be cut off and the fuse cutoff time information indicating the time to cut off the electronic fuse in a case where there is an electronic fuse to be intentionally cut off is described. However, as illustrated in the sixth embodiment, in a case where the communication system 100 includes the central ECU 101, the zone ECUs 104 to 107, and the slave ECUs 108 to 116, the zone ECUs 104 to 107 may store the cutoff fuse notification information and the fuse cutoff time information related to the electronic fuses under their control. In addition, in a case where the zone ECUs 104 to 107 notify the central ECU 101 of the state of the electronic fuses under their control, the central ECU 101 may store the cutoff fuse notification information and the fuse cutoff time information related to all the electronic fuses of the communication system 100.

(Modification 11)

In the fourth embodiment, the mode in which the master ECU 2 transmits the cutoff fuse notification information and the fuse cutoff time information to the slave ECUs 3 and 4 is described. However, as illustrated in the sixth embodiment, in a case where the communication system 100 includes the central ECU 101, the zone ECUs 104 to 107, and the slave ECUs 108 to 116, the zone ECUs 104 to 107 may transmit the cutoff fuse notification information and the fuse cutoff time information to all the slave ECUs 108 to 116.

(Modification 12)

In the fourth embodiment, the mode in which the interruption diagnostic information is invalidated near the time indicated by the fuse cutoff time information is described. However, the interruption diagnostic information may be invalidated from the time indicated by the fuse cutoff time information until a preset invalidation end condition is satisfied. The invalidation end condition is, for example, acquiring the conduction fuse notification information indicating that the corresponding electronic fuse is turned on, or receiving a communication frame from the ECU that is the target of the interruption diagnostic information.

The control sections 11 and 31 and their methods described in the present disclosure may be implemented by a dedicated computer provided by configuring a processor and a memory programmed to execute one or more functions embodied by a computer program. Alternatively, the control sections 11 and 31 and their methods described in the present disclosure may be implemented by a dedicated computer provided by configuring a processor with one or more dedicated hardware logic circuits. Alternatively, the control sections 11 and 31 and their methods described in the present disclosure may be implemented by one or more dedicated computers configured by a combination of a processor and a memory programmed to execute one or more functions and one or more hardware logic circuits. The computer program may be stored in a computer-readable non-transitory tangible recording medium as instructions executed by a computer. The method for realizing the functions of each section included in the control sections 11 and 31 does not necessarily include software, and all the functions may be realized using one or more hardware.

The multiple functions of one component in the above embodiment may be realized by multiple components, or one function of one component may be realized by multiple components. Also, the multiple functions of multiple components may be realized by one component, or one function realized by multiple components may be realized by one component. Further, some of the configurations of the above embodiment may be omitted. Also, at least some of the configurations of the above embodiment may be added to or replaced with the configurations of other embodiments.

In addition to the ECUs 2 to 4, 101, and 104 to 116 described above, the present disclosure can be implemented in various forms such as a system including the ECUs 2 to 4, 101, and 104 to 116 as components, a program for causing a computer to function as the ECUs 2 to 4, 101, and 104 to 116, a non-transitory tangible recording medium such as a semiconductor memory in which the program is recorded, and a communication method.

What is claimed is:

1. A communication system comprising:

a first control device that receives a power supply from a power source via a first electronic fuse;

a second control device that is data-communicably connected to the first control device and receives a power supply from the power source via a second electronic fuse;

a management device that is data-communicably connected between the first control device and the second control device;

a switching control section configured to execute switching control to switch the first electronic fuse and the second electronic fuse between an on state and an off state;

a diagnostic information storage section configured to store diagnostic information related to communication with the first control device; and a state information storage section configured to store first fuse state information related to a state of the first electronic fuse, which is referred to for invalidating the diagnostic information.

2. The communication system according to claim 1, further comprising a cutoff notification transmission section configured to transmit first power supply cutoff related information related to cutting off the power supply from the power source via the first electronic fuse before or after turning the first electronic fuse into the off state to cut off the power supply from the power source to the first control device, wherein the state information storage section is configured to store the first fuse state information due to receiving the first power supply cutoff related information.

3. The communication system according to claim 2, wherein the cutoff notification transmission section is configured to transmit power supply cutoff notification information as the first power supply cutoff related information to the first control device, notifying that the power supply from the power source via the first electronic fuse is cut off before turning the first electronic fuse into the off state to cut off the power supply from the power source to the first control device; and the state information storage section is configured to determine whether the power supply cutoff notification information is stored in the first control device when activated by the power supply from the power source, and store power supply restoration date and time information indicating date and time when the first control device was most recently activated as the first fuse state information in a case where the power supply cutoff notification information is stored.

4. The communication system according to claim 2, wherein the cutoff notification transmission section is configured to transmit first cutoff fuse notification information for making a notification of the first electronic fuse to be cut off and first fuse cutoff time information indicating time to cut off the first electronic fuse as the first power supply cutoff related information to the second control device before or after turning the first electronic fuse in the off state to cut off the power supply from the power source to the first control device; and the state information storage section is configured to store the first cutoff fuse notification information and the first fuse cutoff time information received by the second control device as the first fuse state information.

5. The communication system according to claim 2, wherein the first control device includes a backup power source, the cutoff notification transmission section is configured to transmit power supply cutoff notification information as the first power supply cutoff related information to the first control device, notifying that the power supply from the power source via the first electronic fuse is cut off before turning the first electronic fuse in the off state to cut off the power supply from the power source to the first control device, and the state information storage section is configured to determine whether the power supply cutoff notification information is acquired when the power supply from the power source is cut off, and store power supply cutoff information indicating that the power supply is cut off as the first fuse state information in a case where the power supply cutoff notification information is acquired.

6. The communication system according to claim 1, wherein the state information storage section is configured to store first cutoff fuse notification information for making a notification of the first electronic fuse to be cut off and first fuse cutoff time information indicating time to cut off the first electronic fuse as the first fuse state information in the management device before turning the first electronic fuse into the off state to cut off the power supply from the power source to the first control device, and store second cutoff fuse notification information for making a notification of the second electronic fuse to be cut off and second fuse cutoff time information indicating time to cut off the second electronic fuse in the management device before turning the second electronic fuse into the off state to cut off the power supply from the power source to the second control device.

7. The communication system according to claim 1, wherein the first control device includes a first request section configured to transmit a second status checking request inquiring about the state of the second electronic fuse to the management device when storing second communication interruption diagnostic information indicating communication with the second control device is interrupted, the second control device includes a second request section configured to transmit a first status checking request inquiring about the state of the first electronic fuse to the management device when storing first communication interruption diagnostic information indicating that communication with the first control device is interrupted, the management device includes a response section configured to check the state of the second electronic fuse to transmit second electronic fuse state information indicating a checking result to the first control device when acquiring the second status checking request from the first control device, and check the state of the first electronic fuse to transmit first electronic fuse state information indicating a checking result to the second control device when acquiring the first status checking request from the second control device, and the state information storage section is configured to store the acquired first electronic fuse state information as the first fuse state information in the second control device.

8. The communication system according to claim 4, wherein the cutoff notification transmission section is configured to transmit the first cutoff fuse notification information and the first fuse cutoff time information to all electronic control devices connected to a communication bus identical to a communication bus for the first control device and a communication bus through which communication with the first control device is allowed to be performed via the management device.

9. The communication system according to claim 7, wherein the response section of the management device is configured to transmit the first electronic fuse state information to all electronic control devices connected to a communication bus identical to a communication bus for the first control device and a communication bus through which communication with the first control device is allowed to be performed via the management device.

10. The communication system according to claim 2, wherein the cutoff notification transmission section is configured to transmit power supply cutoff notification information as the first power supply cutoff related information to the first control device, notifying that the power supply from the power source via the first electronic fuse is cut off before turning the first electronic fuse into the off state to cut off the power supply from the power source to the first control device, and the state information storage section is configured to store power supply restoration date and time information indicating date and time when the first control device was most recently activated as the first fuse state information when activated by the power supply from the power source.

11. The communication system according to claim 2, wherein the first control device includes a backup power source, the cutoff notification transmission section is configured to transmit power supply cutoff notification information as the first power supply cutoff related information to the first control device, notifying that the power supply from the power source via the first electronic fuse is cut off before turning off the first electronic fuse to cut off the power supply from the power source to the first control device, and the state information storage section is configured to store power supply cutoff information indicating that the power supply is cut off as the first fuse state information when the power supply from the power source is cut off.

12. The communication system according to claim 1, wherein at least one of electronic control devices included in the communication system is configured to invalidate the diagnostic information based on the first fuse state information.

13. The communication system according to claim 1, wherein a service tool connected to the communication system is configured to invalidate the diagnostic information based on the first fuse state information.

14. The communication system according to claim 3, wherein the second control device is configured to invalidate the diagnostic information based on the first fuse state information retroactively to timing when the power supply cutoff notification information is acquired.

15. The communication system according to claim 14, wherein the second control device is configured to terminate invalidation of the diagnostic information when a preset invalidation end condition is satisfied.

16. The communication system according to claim 3, wherein the cutoff notification transmission section is configured to transmit the first power supply cutoff related information to all electronic control devices included in the communication system.

17. The communication system according to claim 7, wherein the communication system includes the first control device and the second control device as slave control devices, the communication system includes a zone control device that is data-communicably connected to the slave control devices and is configured to control operation of the first electronic fuse and the second electronic fuse, and a central control device that is data-communicably connected to the zone control device as the management device, the first request section is configured to transmit the second status checking request to all zone control devices included in the communication system, and the second request section is configured to transmit the first status checking request to all the zone control devices included in the communication system.

18. The communication system according to claim 7, wherein the communication system includes the first control device and the second control device as slave control devices, the communication system includes a zone control device that is data-communicably connected to the slave control devices and is configured to control operation of the first electronic fuse and the second electronic fuse, and a central control device that is data-communicably connected to the zone control device as the management device, the first request section is configured to transmit the second status checking request to the central control device, and the second request section is configured to transmit the first status checking request to the central control device.

* * * * *